(12) United States Patent
Diorio et al.

(10) Patent No.: US 7,394,324 B2
(45) Date of Patent: Jul. 1, 2008

(54) METHOD AND SYSTEM TO CALIBRATE AN OSCILLATOR WITHIN AN RFID CIRCUIT UTILIZING A TEST SIGNAL SUPPLIED TO THE RFID CIRCUIT

(75) Inventors: Christopher J. Diorio, Shoreline, WA (US); Vadim Gutnik, Irvine, CA (US); Todd E. Humes, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 1008 days.

(21) Appl. No.: 10/824,071

(22) Filed: Apr. 13, 2004

(65) Prior Publication Data

US 2005/0240369 A1 Oct. 27, 2005

(51) Int. Cl.
G01R 23/00 (2006.01)
H03B 5/04 (2006.01)
H03L 1/00 (2006.01)

(52) U.S. Cl. ............... 331/44; 331/175; 331/179

(58) Field of Classification Search ............ 331/44, 331/68, 74, 175, 179
See application file for complete search history.

(56) References Cited

U.S. PATENT DOCUMENTS

| | | | |
|---|---|---|---|
| 3,938,316 A | 2/1976 | Morokawa et al. | |
| 4,454,483 A | 6/1984 | Baylor | |
| 5,117,756 A | 6/1992 | Goffin, II et al. | |
| 5,583,819 A | 12/1996 | Roesner et al. | |
| 5,649,295 A | 7/1997 | Shober et al. | |
| 5,867,535 A | 2/1999 | Phillips et al. | |
| 5,912,632 A | 6/1999 | Dieska et al. | |
| 6,046,683 A | 4/2000 | Pidwerbetsky et al. | |
| 6,243,013 B1 | 6/2001 | Duan et al. | |
| 6,356,161 B1 | 3/2002 | Nolan et al. | |
| 6,388,532 B1 | 5/2002 | Babcock | |
| 6,404,325 B1 | 6/2002 | Heinrich et al. | |
| 6,472,943 B1 | 10/2002 | Soong et al. | |
| 6,639,509 B1 | 10/2003 | Martinez | |
| 6,853,582 B1 * | 2/2005 | Matsuda et al. | 365/185.18 |
| 2002/0167405 A1 | 11/2002 | Shanks et al. | |

FOREIGN PATENT DOCUMENTS

WO WO-02065380 8/2002

OTHER PUBLICATIONS

Finkenzeller, Klaus , "Fundamental Operation Principles", *RFID Handbook:: Fundamentals and Applications in Contactless Smart Cards and Identifications, John Wiley & Sons, Ltd ISBN: 0-470-84402-7*, (2003),pp.29-59.

* cited by examiner

*Primary Examiner*—David Mis
(74) *Attorney, Agent, or Firm*—Schwegman, Lundberg & Woessner, P.A.

(57) ABSTRACT

In accordance with one aspect of the present invention, there is provided a method of calibrating an oscillator within a radio-frequency identification (RFID) circuit for use in an RFID tag. The oscillator has an oscillation frequency. A calibration value is stored within a non-volatile memory associated with the RFID circuit. The oscillator is calibrated in accordance with the calibration value. The storing of the calibration value includes recovering a reference frequency from a test signal supplied to the RFID circuit, calculating the calibration value to correspond to a difference between the recovered reference frequency and the oscillator frequency, and writing the calibration value to the non-volatile memory.

17 Claims, 17 Drawing Sheets

US 7,394,324 B2

METHOD AND SYSTEM TO CALIBRATE AN OSCILLATOR WITHIN AN RFID CIRCUIT UTILIZING A TEST SIGNAL SUPPLIED TO THE RFID CIRCUIT

FIELD OF THE INVENTION

An embodiment relates generally to the field of oscillator calibration and, more specifically, to an apparatus and a method to calibrate an oscillator for a radio-frequency identification (RFID) system.

BACKGROUND OF THE INVENTION

Radio-frequency identification tags (or transponders) require a reference frequency for a number of purposes. An RFID reader transmits RF power to RFID tags. RFID tags modulate reflected RF power to transmit data back to an RFID reader. The reflected RF is called 'backscatter,' and the link from the tag back to the reader is typically referred to as the 'backscatter link. The backscatter modulation of course requires a backscatter frequency to which the relevant RFID reader is sensitive. Furthermore, backscatter communications may be subject to regulatory restrictions, and may need to be compliant with one or more RFID communications specifications or standards. An RFID tag also requires a demodulation frequency so as to enable a demodulator within the RFID tag to demodulate received radio-frequency signals, and decode data contained therein. RFID tags also need to generate internal clock signals to clock various functional units that may be included within the RFID tag.

With a view to generating the above-identified frequency and clock signals within an RFID tag, the RFID tag is typically equipped with an oscillator that generates the reference frequency. Three prior art mechanisms for providing such a reference frequency are discussed below. FIG. 1 is a schematic illustration of a first prior art oscillator arrangement 10 in which an oscillator 12 is coupled to a crystal 14 in order to provide a precise local reference frequency. Alternatively, the oscillator 12 may be coupled to an L-C tank or electron mobility-based reference in order to provide the precise local reference frequency. A disadvantage of such arrangements is that they tend to be bulky, and high-power consumers.

A second manner in which it is known to provide a reference frequency within an RFID chip is to provide a phase-locked loop (PLL) arrangement, such as that illustrated by the schematic diagram of FIG. 2. Specifically, the phase-locked loop arrangement 16 of FIG. 2 is shown to include a phase detector 18 that is coupled to receive a reference frequency 20 and the oscillator output, compare them, and to provide a reference signal 22 to an oscillator 24. The disadvantages of the phase-locked loop arrangement 16 shown in FIG. 2 include the required provision of a reference frequency, a long start-up time, the provision of extra power for the phase detector 18, as well as the extra chip area requirements for provision of the phase detector 18. A similar function can also be done with a frequency detector, and a frequency-locked loop.

A third prior art arrangement 26 to provide a reference frequency within an RFID tag is illustrated by the schematic diagram of FIG. 3. Specifically, a trimming arrangement 28 comprising a combination of resistors, capacitors and inductors (or fuses or resistors that may be laser-cut) provide a reference signal 22 (e.g., a current reference signal $I_{ref}$) to an oscillator 30. Among the disadvantages of this arrangement are that the trimming arrangement may be expensive to build, and the configuration of the trimming arrangement 28 is permanent (i.e., the oscillator 30 cannot be dynamically calibrated).

FIGS. 4 and 5 are diagrammatic representations of a prior art RFID system 32 including an RFID tag 34 that is interrogated by, and responds to, an RFID reader 36 utilizing a radio-frequency forward link and a backscatter return link. The RFID tag 34 is shown to provide a signal received from the RFID reader 36, via the radio-frequency forward link, to a demodulator 38, which recovers a timing (or clock) signal 40. The recovered clock signal 40 is utilized to generate a digital calibration value 44, which is stored in a volatile register 42. The volatile register 42 in turn provides the digital calibration value 44 to a digitally-controlled oscillator (DCO) 46. The digitally-controlled oscillator 46 outputs a demodulator clock signal 48.

FIG. 5 illustrates the oscillator 46 of the RFID tag 32, again calibrated utilizing a digital calibration value 44 provided to the oscillator 46 from the volatile register 42. The oscillator 46 generates a modulator clock signal 52 to a modulator 50, the modulator 50 utilizing the modulator clock signal 52 to backscatter modulate communications transmitted via the backscatter return link to the RFID reader 36.

In summary, it will be appreciated that, on start-up, the RFID reader 36 sends a radio-frequency forward link signal to the RFID tag 34, which extracts a timing (or clock) signal 40 from the received signal to calibrate the oscillator 46, this recovered timing signal 40 being communicated to the oscillator 46 via the register 42. During backscatter communications, the calibration is held by the oscillator 46, which is in turn utilized to drive the modulator 50.

Accordingly, in the prior art system shown in FIGS. 4 and 5, the recovered timing signal 40 is stored within a volatile register that is utilized to calibrate the oscillator. However, a clock recovery operation is required by the demodulator 38 upon each power-up event, which may negatively impact the performance of the RFID tag 32.

U.S. Pat. No. 5,583,819, entitled "Apparatus and Method of Use of Radiofrequency Identification Tags", to Bruce B. Roesner and Ronald M. Ames, discloses an RFID tag in which a reference signal is initially generated by comparing an incoming standard signal, and placing it in a temporary or permanent storage within the RFID tag. Signals arriving later are then compared to the captured standard, and variations from the captured standards are detected to allow for decoding of the data. Specifically, a microprocessor is described as providing a correction signal to a memory, the correction signal then being stored within the memory as a correction value for use in subsequent operation of the RFID tag, or at least until the correction value is updated. The memory is described as possibly being a non-volatile memory to allow calibration information to be permanently stored, so that reconfiguration of the internal oscillator is not required each time the RFID tag is powered up.

In the system described by Roesner, the calibration of the oscillator is nonetheless dependent upon an initial extraction or recovery of timing from a received radio-frequency signal.

SUMMARY OF THE INVENTION

In accordance with one aspect of the present invention, there is provided a method of calibrating an oscillator within a radio-frequency identification (RFID) circuit for use in an RFID tag. The oscillator has an oscillation frequency. A calibration value is stored within a non-volatile memory associated with the RFID circuit. The oscillator is calibrated in accordance with the calibration value. The storing of the calibration value includes recovering a reference frequency from a test signal supplied to the RFID circuit, calculating the calibration value to correspond to a difference between the recovered reference frequency and the oscillator frequency, and writing the calibration value to the non-volatile memory.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A calibrated oscillator for an RFID system, and methods of manufacturing and operating the same, are described. In the following description, for purposes of explanation, numerous specific details are set forth in order to provide a thorough understanding of the present invention. It will be evident, however, to one skilled in the art that the present invention may be practiced without these specific details.

Figure 1:
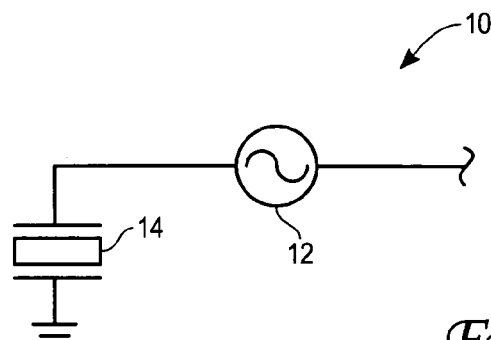
FIG. 1 is a schematic illustration of a first prior art oscillator arrangement in which an oscillator is coupled to a crystal in order to provide a precise local reference frequency.
Figure 2:
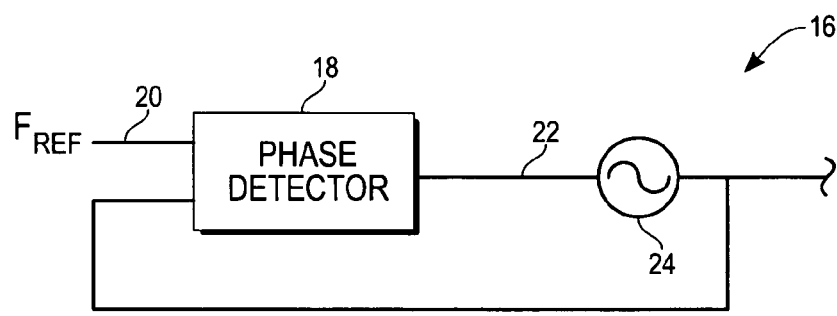
FIG. 2 is a schematic illustration of a phase-locked loop arrangement that includes a phase detector coupled to receive a reference frequency and the oscillator output, to compare them, and to provide a reference signal to an oscillator.
Figure 3:
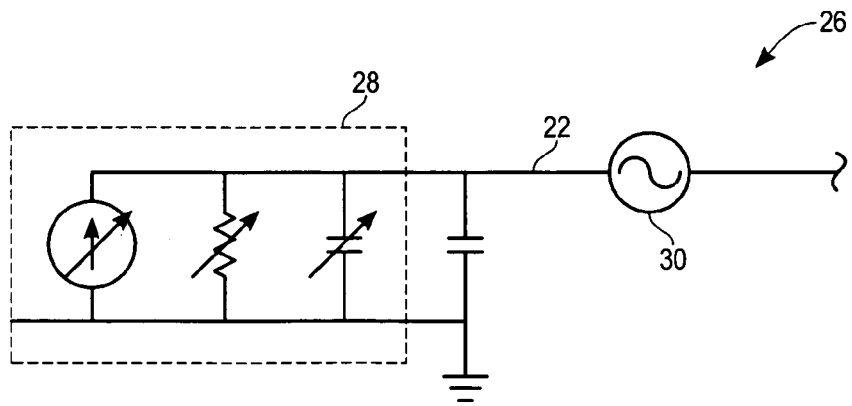
FIG. 3 is a schematic illustration of a prior art trimming arrangement to provide a reference frequency within an RFID tag.
Figure 4:
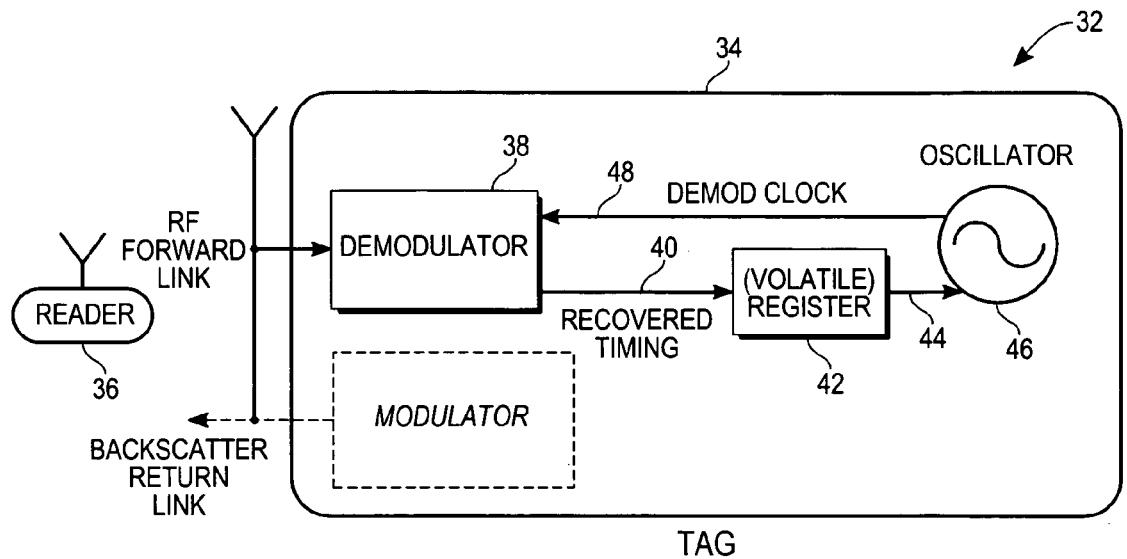
FIGS. 4 and 5 are diagrammatic representations of a prior art RFID system including an RFID tag that is interrogated by, and responds to, an RFID reader utilizing a radio-frequency forward link and a backscatter return link.
Figure 5:
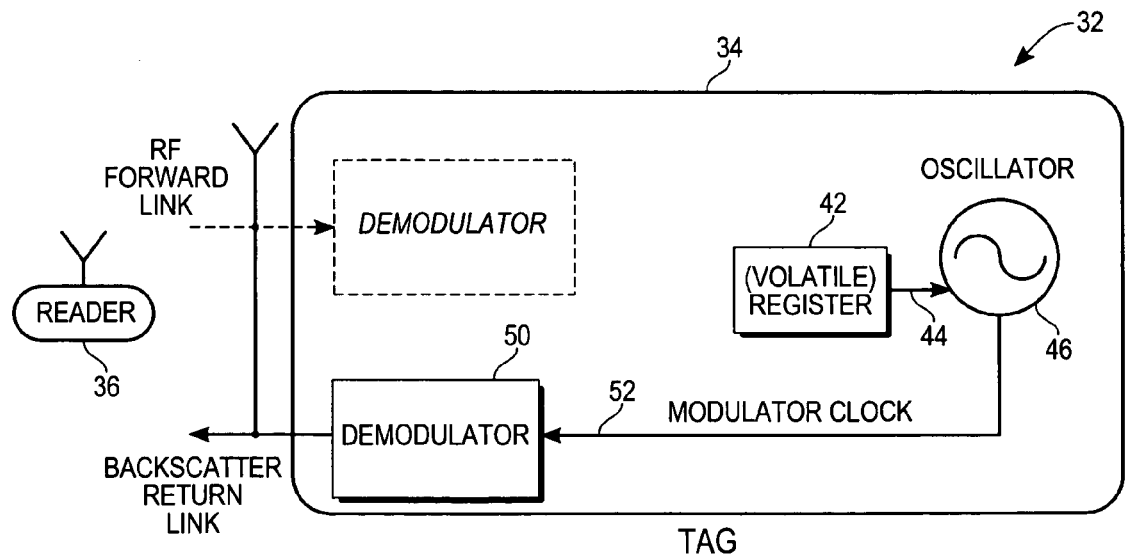
Figure 6:
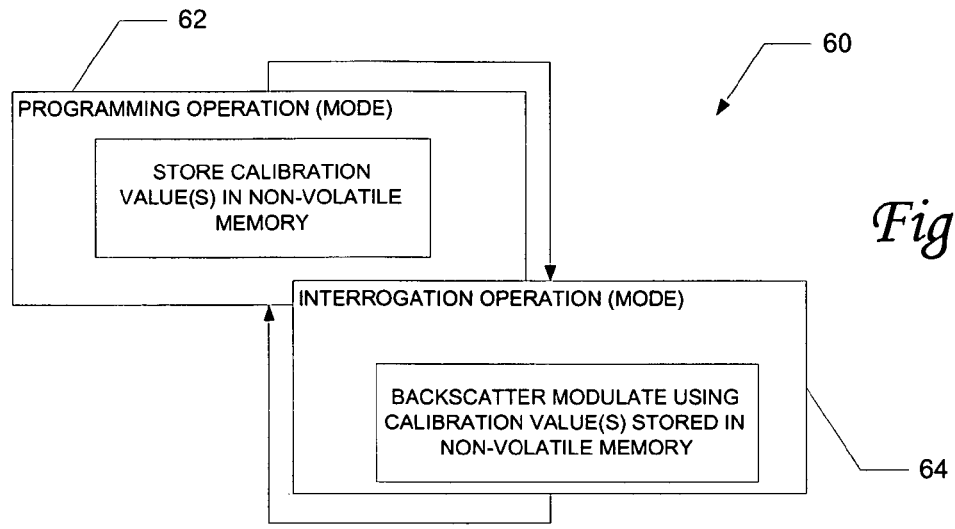
FIG. 6 is a block diagram illustrating multiple operation types that may be performed by a radio-frequency identification (RFID) integrated circuit (IC) suitable for use within an RFID tag assembly.

FIG. 6 is a block diagram illustrating multiple operation types 60 that may be performed by a radio-frequency identification (RFID) integrated circuit (IC) suitable for use within an RFID tag assembly. In an exemplary embodiment, an RFID tag may be a combination of an RFID circuit (e.g., an Integrated Circuit (IC)), and a coupled antenna (or antennae) to facilitate the reception and transmission of radio-frequency signals, the RFID circuit and the antenna(e) being located on a base material or substrate (e.g., a plastic or paper material) to thereby constitute an RFID tag.

As shown in FIG. 6, according to one aspect of the present invention, an RFID integrated circuit may be subject to a programming operation 62, in which one or more calibration values are stored within a non-volatile memory (e.g., a floating-gate MOSFET non-volatile memory). The storage of the calibration values may be performed, for example, to facilitate calibration of an oscillator included within the RFID integrated circuit (in accordance with the one or more calibration values) in advance of an interrogation operation 64. In one embodiment, each calibration value is a delta value according to which the oscillation of the oscillator, within the RFID integrated circuit, is modified. Various exemplary methods by which a calibration values may be written to the non-volatile memory, while an RFID integrated circuit is performing a programming operation 62, are described below.

FIG. 6 also illustrates that an RFID integrated circuit may perform an interrogation operation 64, during which the RFID integrated circuit receives a request from an RFID reader, and then retrieves (or generates) reply information, which is encoded in a backscatter modulated radio-frequency signal transmitted from the RFID tag back to the RFID reader. The backscatter modulation is performed utilizing the one or more calibration values stored within the non-volatile memory. The data included within the backscatter modulated radio-frequency signal may include, for example, one or more identification codes (e.g., an Electronic Product Code (EPC)) stored in a memory of the RFID tag. A number of exemplary embodiments of methods by which such backscatter modulation may be achieved, and by which various oscillation frequencies and clock signals may be generated within an RFID integrated circuit, are discussed below.

Dealing first with examples of programming operations 62, FIGS. 7A, 7B, 8A, and 8B are block diagrams providing high-level depictions of systems 66 and 67, by which one or more calibration values may be provided to an RFID integrated circuit, and written into a non-volatile memory associated with such an RFID integrated circuit. Specifically, a test system 66 shown in FIG. 7A includes an RFID integrated circuit test device 68 that is coupled to an RFID integrated circuit 70 so as to enable the test device 68 to provide a test signal to the RFID integrated circuit 70. To this end, the RFID integrated circuit 70 includes a suitable interface (not shown) to receive the test signal from the test device 68. The test device 68 may be any one of a number of test devices (e.g., a wafer testing device, a die testing device, or an individual IC testing device) that are commonly used in IC fabrication to test the functionality of integrated circuits. As such, the RFID integrated circuit 70 may be included in a semiconductor wafer that is undergoing testing, and the test device 68 may comprise a probe-tester.

Figure 7A:
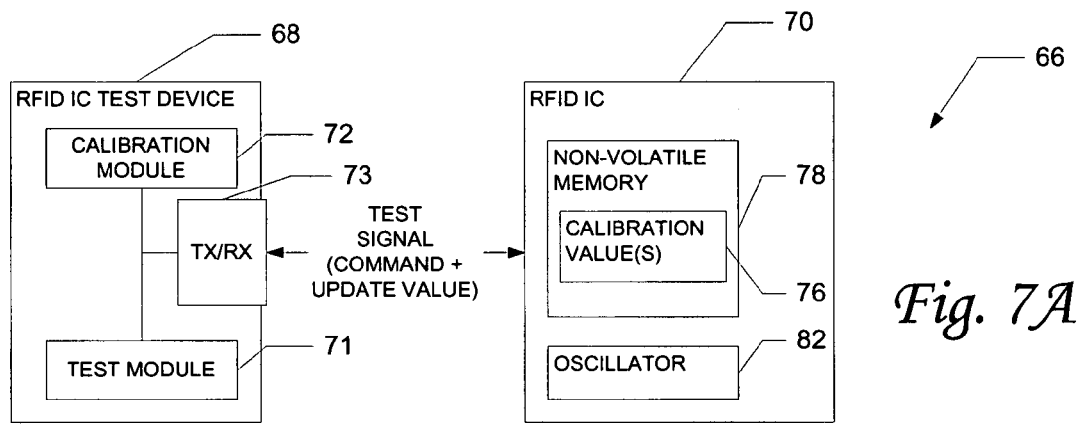
FIGS. 7A, 7B, 8A, and 8B are block diagrams providing high-level depictions of systems, in which one or more calibration values may be provided to an RFID integrated circuit, and written into a non-volatile memory associated with such an RFID integrated circuit.

As shown in FIG. 7A, the test device 68 includes a calibration module 72 that is responsible for the inclusion of calibration data within a test signal supplied to the RFID integrated circuit 70 during testing. The calibration module 72 operates to include calibration data (e.g., a calibration command and an update value) within the test signal, the calibration data causing calibration values 76 to be stored the non-volatile memory of the RFID integrated circuit 70. For example, the calibration data may include an update value by which a previously stored calibration value 76 is to be incremented or decremented so as to properly calibrate an oscillator 82 included within the RFID integrated circuit 70. Alternatively, the update valve may itself constitute a calibration value 76 to replace a previously stored calibration value or to be stored as an initial calibration value. The oscillator 82, also described in further detail below, is utilized in the provision of clock signals to various components (e.g., a modulator) within the RFID integrated circuit 70. The frequency of signals generated by the oscillator 82 may be at least partially determined by the calibration values 76.

In the exemplary embodiment illustrated in FIG. 7A, the test device 68 is also shown to include a transmit/receive (TX/RX) interface 73 via which the test device 68 communicates test signals to the RFID integrated circuit 70, and via which the RFID integrated circuit 70 communicates test result data back to the test device 68. As noted above, the calibration data provided by the calibration module 72 to the RFID integrated circuit 70 may include a calibration command, and an update value. The update value may comprise a delta value by which a previously stored calibration value is to be incremented or decremented. Alternatively, the update value may itself constitute a calibration value to be stored directly into the non-volatile memory 78. In either embodiment, the calibration module 72, as a component of the test device 68, is responsible for the calculation of one or more update values. To this end, the calibration module 72 is additionally configured to receive test data back from the RFID integrated circuit 70, via the transmit/receive interface 73, and to determine whether the generation and communication of a further update value is required in order to properly calibrate the RFID integrated circuit 70. The test data received by the calibration module 72 may comprise the backscatter-modulated output of a modulator included within the RFID integrated circuit 70. In this case, the calibration module 72 recovers timing information from the received backscatter modulated signal to determine whether the frequency modulation of this signal is correct. If not, the calibration module 72 generates an update value with which to modify or replace a currently stored calibration value 76. Accordingly, in the exemplary embodiment, described with reference to FIG. 7A, the logic for the calculation of appropriate calibration values 76 is shown to reside within the test device 68.

Figure 7B:
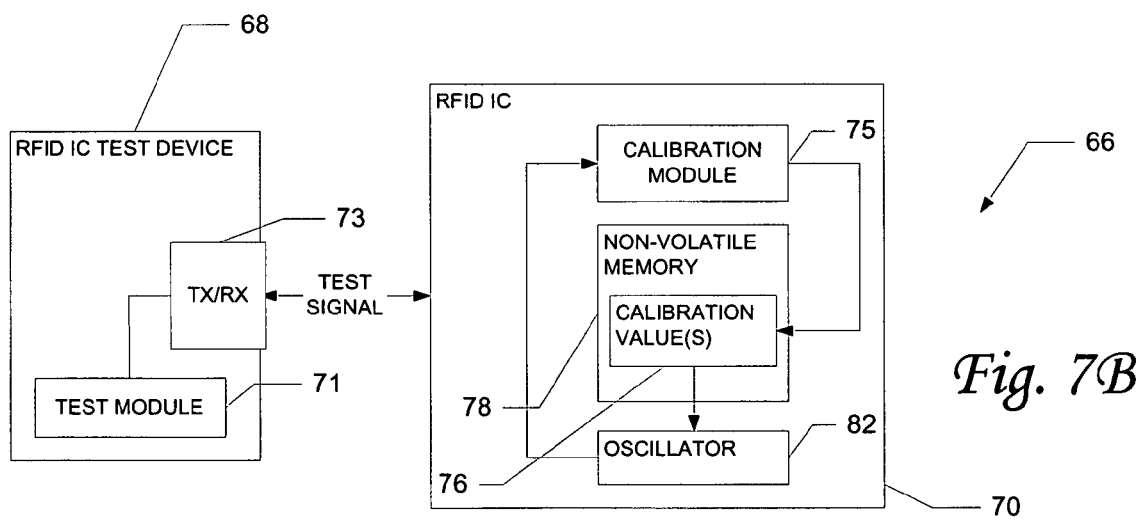

FIG. 7B illustrates an alternative embodiment for the test system 66, wherein the calibration module 75, and accordingly the logic for the calculation and generation of update values, resides in the RFID integrated circuit 70 itself, and not within the test device 68. In this exemplary embodiment, one of the test signals propagated by the transmit/receive interface 73 of the test device 68 may be a frequency signal, which is received by the calibration module 75, and utilized to recover timing or clock information. The calibration module 75 is also shown to receive, as input, the output of an oscillator 82 of the RFID integrated circuit 70. By comparison of the output of the oscillator 82 and the recovered timing information, the calibration module 75 may calculate an appropriate calibration value 76 according to which the oscillator 82 should be calibrated. Having calculated an appropriate calibration value 76, the calibration module 75 proceeds to write this calibration value 76 into the non-volatile memory 78.

Figure 8A:
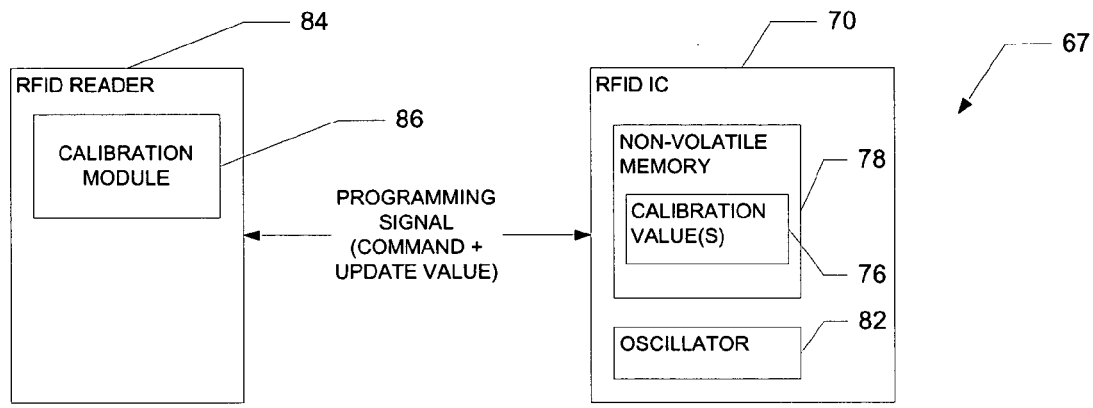

The system 67 shown in FIG. 8A includes an RFID reader 84 that includes a calibration module 86 to include calibration data in radio-frequency signals communicate to an RFID integrated circuit 70 to facilitate the generation and/or storage of the calibration values 76 in the non-volatile memory 78 of an RFID integrated circuit 70.

Figure 8B:
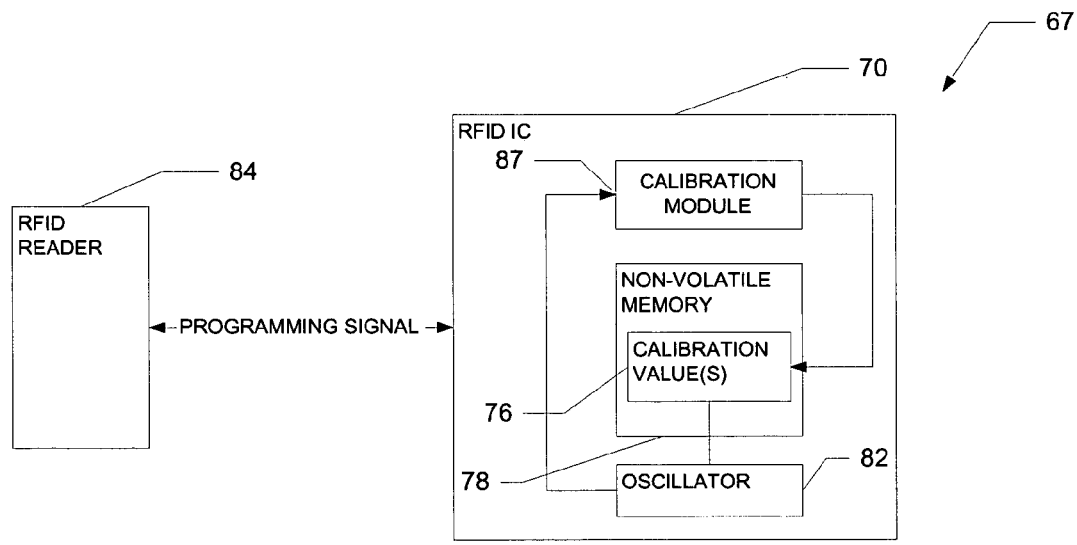

The system 67 shown in FIG. 8A includes a calibration module 86, for example similar to the calibration module 72 described above, within the RFID reader 84. Accordingly, in this embodiment, the calibration logic resides largely with the RFID reader 84. FIG. 8B, on the other hand, shows an alternative embodiment of the system 67, wherein a calibration module 87 resides within the RFID integrated circuit 70. As with the embodiments described above with reference to FIGS. 7A and 7B, the embodiments illustrated in FIGS. 8A and 8B differ. The RFID reader 84, in the embodiment illustrated in FIG. 8A, receives a backscatter modulated signal from the RFID integrated circuit 70, in response to a programming signal, with update values being generated at the RFID reader 84 and then communicated back to the RFID integrated circuit 70. In the embodiment illustrated in FIG. 8B, on the other hand, the calibration module 87 may, as described above, recover timing information from the programming signal, and generate and store the calibration value 76 based on the recovered timing information.

From FIGS. 7A, 7B, 8A and 8B, it will be appreciated that calibration data, according to various embodiments of the present invention, may be provided to an RFID integrated circuit 70 by a test device 68 or an RFID reader 84. Furthermore, the communication of the calibration data is not limited to communication via a radio-frequency link. In other embodiments of the present invention, the calibration data may be provided to the RFID integrated circuit 70 to via a wire link (e.g., via probes of a test device 68). The systems 66 and 67 are also merely exemplary systems by which calibration data may be imparted to, and/or stored within, an RFID integrated circuit 70.

Figure 9:
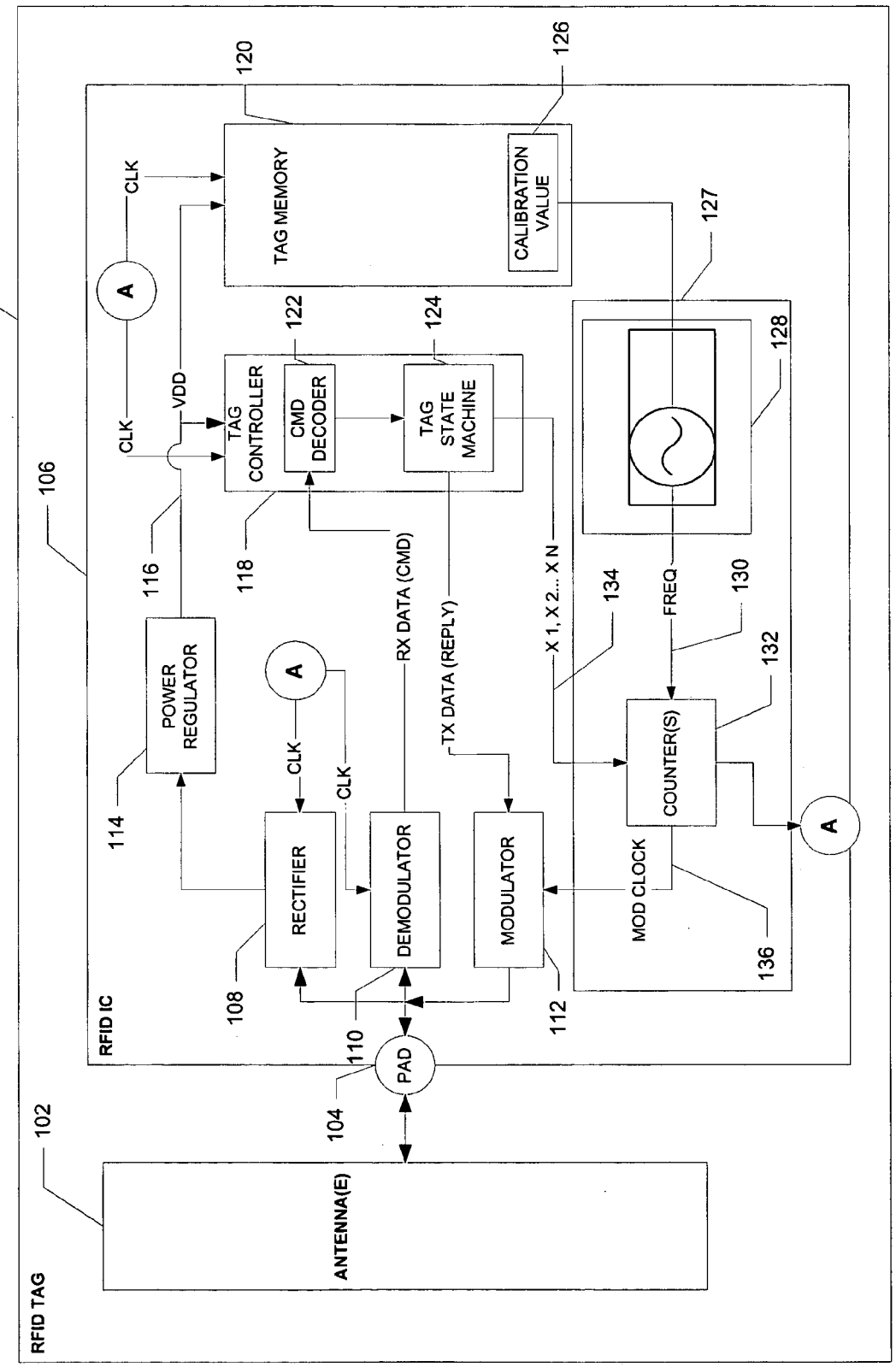
FIG. 9 is a block diagram illustrating an RFID tag, according to an exemplary embodiment of the present invention, that includes one or more antennae coupled to an RFID integrated circuit.

FIG. 9 is a block diagram illustrating an RFID tag 100, according to an exemplary embodiment of the present invention, that includes one or more antennae 102 coupled to an RFID integrated circuit 106, the antennae 102 and integrated circuit 106 being coupled via one or more pads 104, and accommodated on a common substrate or base material.

Turning specifically to the RFID integrated circuit 106, a front-end of the circuit 106 includes a rectifier 108 that operates to extract power from a forward link radio-frequency signal, received via the antenna 102 and communicated to the rectifier 108 via one or more pads 104. The rectifier 108 is coupled to provide extracted power to a power regulator 114, which in turn provides a regulated voltage ($V_{DD}$) to various components of the integrated circuit 106.

The front-end also includes a demodulator 110 that demodulates received radio-frequency signals, and extracts received (RX) data there from, which is then communicated to a tag controller 118. The received data includes, for example, commands, and associated command data, that are issued from an RFID reader (not shown) to interrogate the RFID tag 100. The commands included within the received data may be commands conforming to an RFID communications protocol (e.g., EPC Radio-Frequency Identification Protocol, as specified by the EPC Global Hardware Action Group).

The front-end further includes a modulator 112 that operates to modulate transmission (TX) data that is supplied to the modulator 112 from the tag controller 118. The transmission data may include, for example, data that is retrieved from a tag memory 120 by the tag controller 118, and is provided in a reply responsive to commands included within the received data. This data may include a programmed identification code (e.g., an EPC). The modulator 112 operates to backscatter modulate the transmission data, and to provide a backscatter modulated transmission signal to the antenna 102, which then transmits a backscatter radio-frequency signal.

A back-end of the RFID integrated circuit 106 includes the tag controller 118 and associated tag memory 120. In one exemplary embodiment, the tag controller 118 may conceptually be regarded as a "core" of the RFID circuit 106. The tag controller 118 includes a command decoder 122 to decode commands received within the received data, and to control a state occupied by a tag stage machine 124, responsive to the commands. Specifically, the tag controller 118 may output specific information, and perform certain actions, depending upon the state occupied by the tag state machine 124. As such, the transmission data outputted by the tag state machine may constitute a reply to a specific command included within the received data.

The various components of the RFID integrated circuit 106 require respective clock signals to synchronize operations, and also properly to process information received at and transmitted from the RFID integrated circuit 106 (e.g., the demodulator 110 and the modulator 112 each require respective clock signals to enable proper demodulation and modulation.). To this end, the RFID integrated circuit 106 includes clock generation circuitry 127. In exemplary embodiment, the clock generation circuitry 127 includes a digitally-controlled oscillator (DCO) 128 that is shown to receive, as a control input, a calibration value 126 stored within the non-volatile tag memory 120. The calibration value 126 causes of the frequency of the oscillator 128 to be calibrated to a desired frequency (e.g., a backscatter modulation frequency). In certain embodiments, a register (not shown) may be interposed between the non-volatile tag memory 120 and the digitally-controlled oscillator 128. The oscillator 128 in turn outputs a frequency signal 130 (e.g., a square wave signal), the frequency signal 130 providing input to a counter module 132. The counter module 132 may include one or more counters that utilize the frequency signal 130 to generate one or more clock signals. For example, the counter module 132 may utilize the frequency signal 130 to generate a modulator clock signal 136 that is provided to the modulator 112, so as to enable the modulator 112 to backscatter modulate the transmission data. The counter module 132 is also shown to provide various clock signals to other components of the RFID integrated circuit 106. It will be appreciated that these various clock signals may in fact be the same clock signal, or may be different clock signals, depending upon the requirements of the various components. Further, the counter module 132 may, in one embodiment, form part of the tag controller 118.

It will also be noted that the tag state machine 124 provides a command signal to the counter module 132, in the exemplary form of a multiplication signal 134, which controls the manner in which the counter module 132 generates respective clock signals. For example, a counter within the counter module 132 that is utilized to generate the modulator clock signal 136 may be controlled by the multiplication signal 134 to control the frequency of the modulator clock signal 136. In this embodiment, the frequency with which the modulator 112 modulates a backscatter radio-frequency signal is thus controlled at least partially by the multiplication signal 134. As such, the modulation of the backscatter radio-frequency signal may be performed in accordance with both the oscillation frequency signal 130, that is determined by the calibration value 126, as well as the command signal, in the exemplary form of the multiplication signal 134, that provide input to the counter module 132. Of course, clock signals other than the modulator clock signal 136 may similarly be generated utilizing the frequency signal 130 and the multiplication signal 134.

The exemplary RFID integrated circuit 106 illustrated in FIG. 9 presents a number of advantages. As the oscillation of the oscillator 128 is calibrated utilizing the calibration value 126, which is pre-stored within the non-volatile memory 120 and is not recovered from a radio-frequency signal received on the radio-frequency forward link, operational speed of the RFID integrated circuit 106 may be improved. For example because the oscillator 128 does not require calibration relative to a recovered clock signal on every power-on, performance advantages may be achieved. Further, by allowing the modulation of various clock signals within the RFID integrated circuit 106 to be modified responsive to commands received at the tag 100, an RFID reader is provided with control over backscatter radio-frequency signals that are issued in response to interrogation signals.

Figure 10:
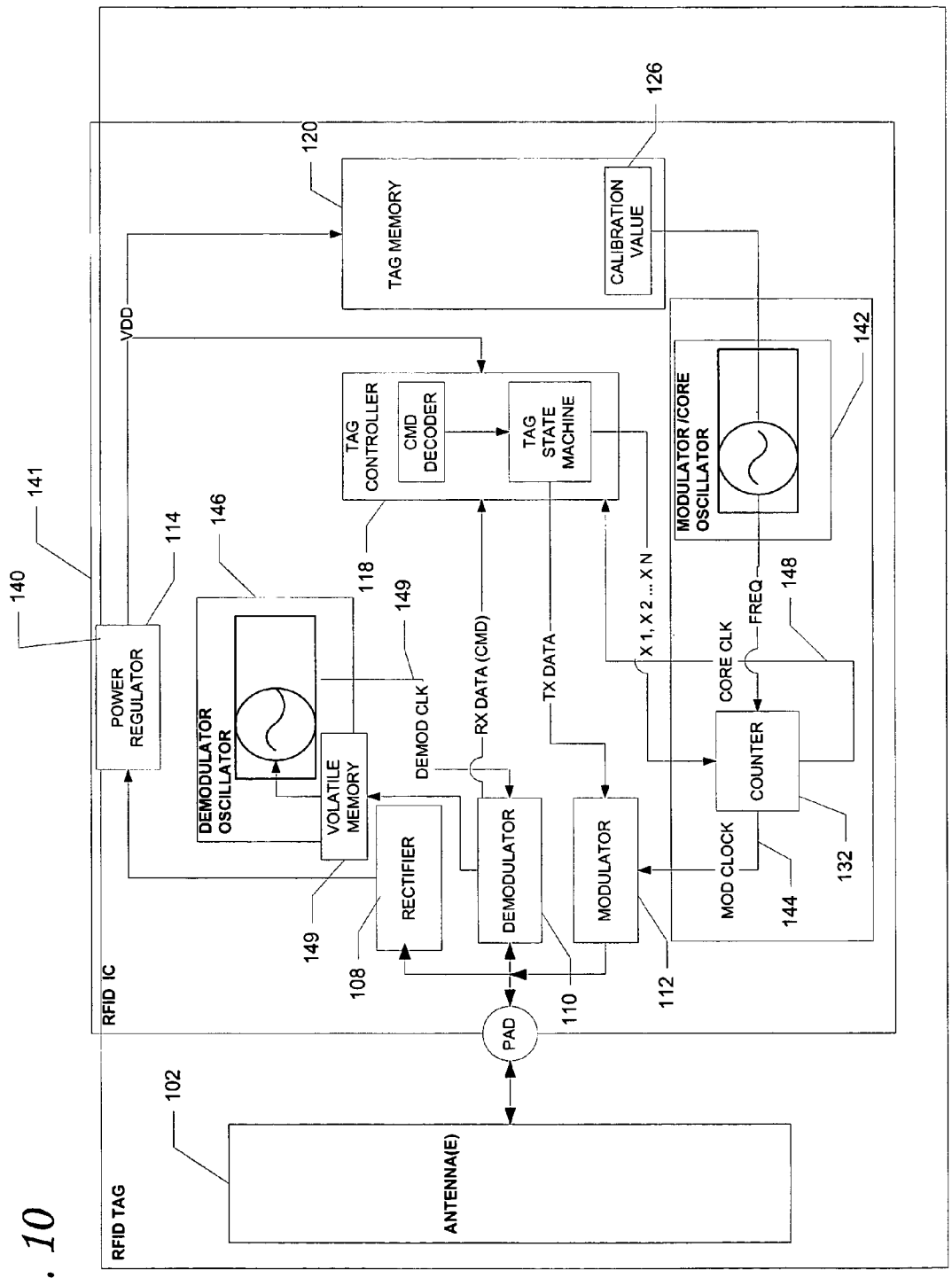
FIG. 10 is a diagrammatic representation of an RFID tag, according to a further exemplary embodiment of the present invention, which again includes one or more antennae and an RFID integrated circuit.

FIG. 10 is a diagrammatic representation of an RFID tag 140, according to a further exemplary embodiment of the present invention, which again includes one or more antennae 102 and an RFID integrated circuit 141. The integrated circuit 141 differs from the exemplary embodiment in FIG. 9 in that a dual-oscillator architecture is provided. Specifically, the integrated circuit 141 includes (1) a modulator/core oscillator 142 that is utilized to generate a modulator clock signal 144 and a core clock signal 148, and (2) a demodulator oscillator 146 that is utilized to generate a demodulator clock 149. The oscillators 142 and 146 are distinguished in that the modulator/core oscillator 142 may be calibrated utilizing one or more calibration value 126 stored within the non-volatile tag memory 120, whereas the demodulator oscillator 146 is driven by timing recovered from a received radio-frequency signal.

The dual-oscillator architecture provides the advantage that the need for over-sampling of a received radio-frequency signal may be reduced relative to the over-sampling requirements of the architecture described above with reference to FIG. 9. Nonetheless, the advantages provided by calibrating the modulator/core oscillator 142, utilizing a calibration value 126 stored within a non-volatile memory, as described above with reference to FIG. 9, remain.

Figure 11:
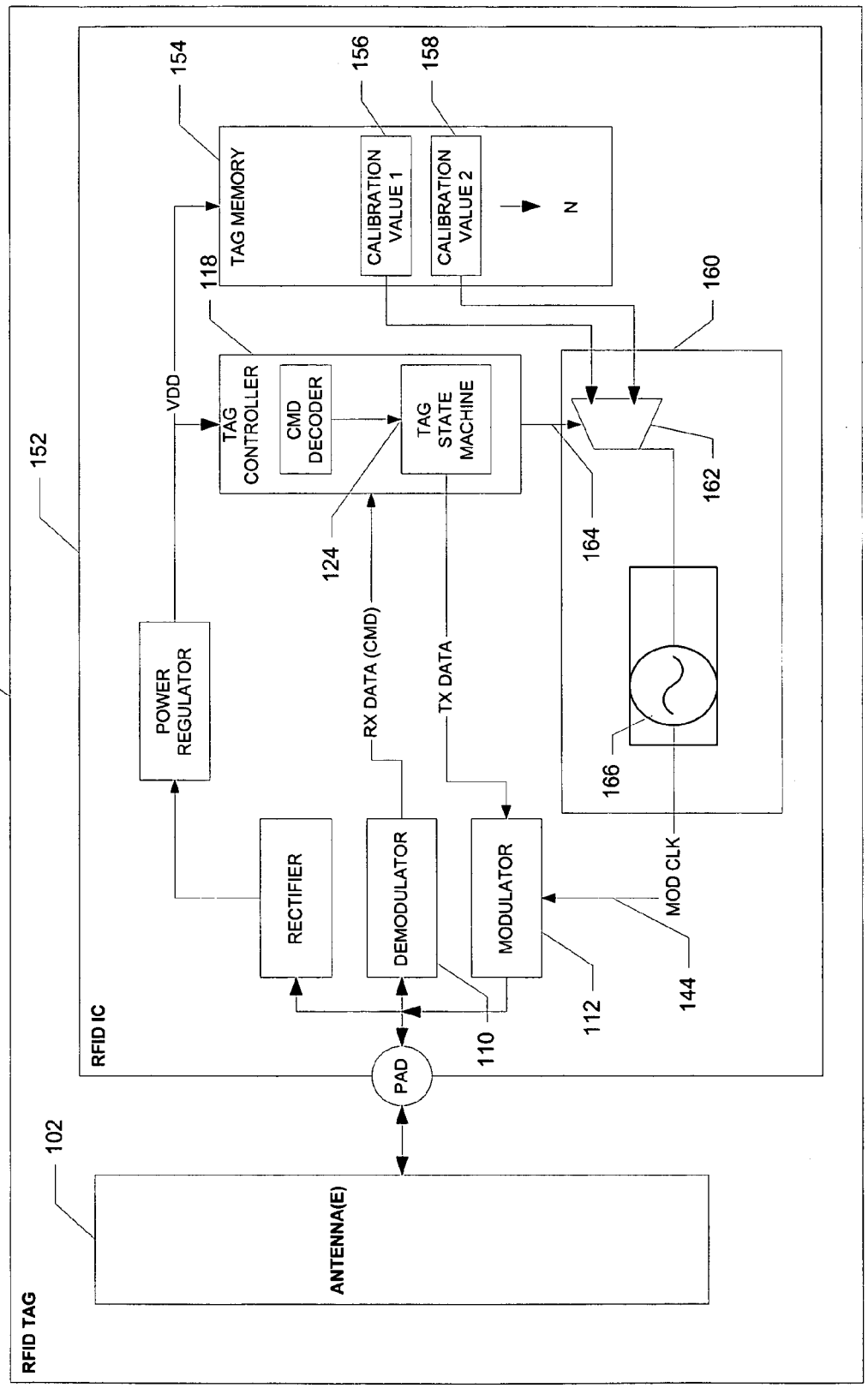
FIG. 11 is a diagrammatic representative of yet a further exemplary embodiment of an RFID tag, according to an exemplary embodiment of the present invention.

FIG. 11 is a diagrammatic representative of yet a further exemplary embodiment of an RFID tag 150. Again, the RFID tag 150 is comprised of an antenna 102 coupled to an RFID integrated circuit 152. The RFID integrated circuit 152 is shown to include a non-volatile tag memory 154 in which are stored multiple calibration values 156, 158. Clock generation circuitry 160 includes a selection mechanism, in the exemplary form of a multiplexer (MUX) 162, which is operable by the tag state machine 124 (in turn responsive to a decoded command) to select one of the multiple calibration values 156, 158 stored within the non-volatile tag memory 154. The selected calibration value is then utilized to drive a digitally-controlled oscillator (DCO) 166, which in turn generates a modulator clock signal 144. For the sake of simplicity, the clock generation circuitry 160 is only shown to generate a modulator clock signal 144. It will nonetheless be appreciated that the clock generation circuitry 160 may be utilized to produce clock signals for any of the components of the RFID integrated circuit 152.

The architecture illustrated in FIG. 11 is advantageous in that an oscillator can accordingly be driven by any one of multiple calibration values stored within a non-volatile memory 154, the choice of calibration values being controlled by the tag controller 118.

As described above, the selection performed by the tag controller 118 may be performed responsive to a command sent, for example, by an RFID reader and included in the received data extracted by the demodulator 110. Consider the situation in which an RFID reader (not shown) requires the RFID tag 150 to backscatter at one of a number of possible backscatter frequencies. In this embodiment, a number of backscatter values, corresponding to a number of possible backscatter frequencies, may be stored in the tag memory 154. A command may be then communicated from the RFID reader to the RFID tag 150, instructing a specific backscatter frequency. Responsive to this command, the tag state machine 124 may be placed in a state in which a calibration value, to calibrate the oscillator 166 to generate an appropriate modulator clock signal 144, may be selected for input, via the MUX 162, to the digitally-controlled oscillator 166. In this manner, the output of the tag state machine 124 can be utilized to control the frequency of a modulator clock signal provided to a modulator 112 of an RFID integrated circuit. However, in the embodiment illustrated in FIG. 11, as opposed to generating a multiplication signal 134, the tag state machine 124 outputs a MUX selection signal 164. In other embodiments of the present invention, the selection of an appropriate calibration value may be performed by the tag controller 118 responsive to other inputs or conditions, such as a mode of operation of the RFID tag 150, a sensed temperature of a component of the RFID tag 150 or of a particular environmental (or ambient) condition, a voltage within the RFID tag 150, etc. Information regarding such other inputs or conditions may be provided to the tag controller 118 via commands received from an RFID reader, or via sensors that are coupled to the RFID tag 150. In further exemplary embodiments, a frequency of an RFID chip may be changed in response to process variations as measured by threshold voltage relative to an on-chip voltage reference, or may be changed in response to a measure of noise an interference seen by the demodulator.

The storage of multiple calibration values 156 and 158, and the ability to dynamically select a calibration value to drive an oscillator, is advantageous in that this allows the clock signals within the RFID integrated circuit 152 to be dynamically varied in response to received commands, or monitored internal or external conditions. For example, in order to render the RFID tag 150 operable in a number of different regulatory environments, the frequency may need to be adjusted by 10%, for example, to fit within regulatory constraints. In this case, the reader sends a command to switch to an appropriate frequency, responsive to which the RFID tag 150 would switch to the correct frequency. In another embodiment, a sensor (or other component, e.g., the demodulator) may provide an indication that received power is low and the clock may then be slowed automatically to save power, at the expense of a reduced set of recognized commands.

Figure 12:
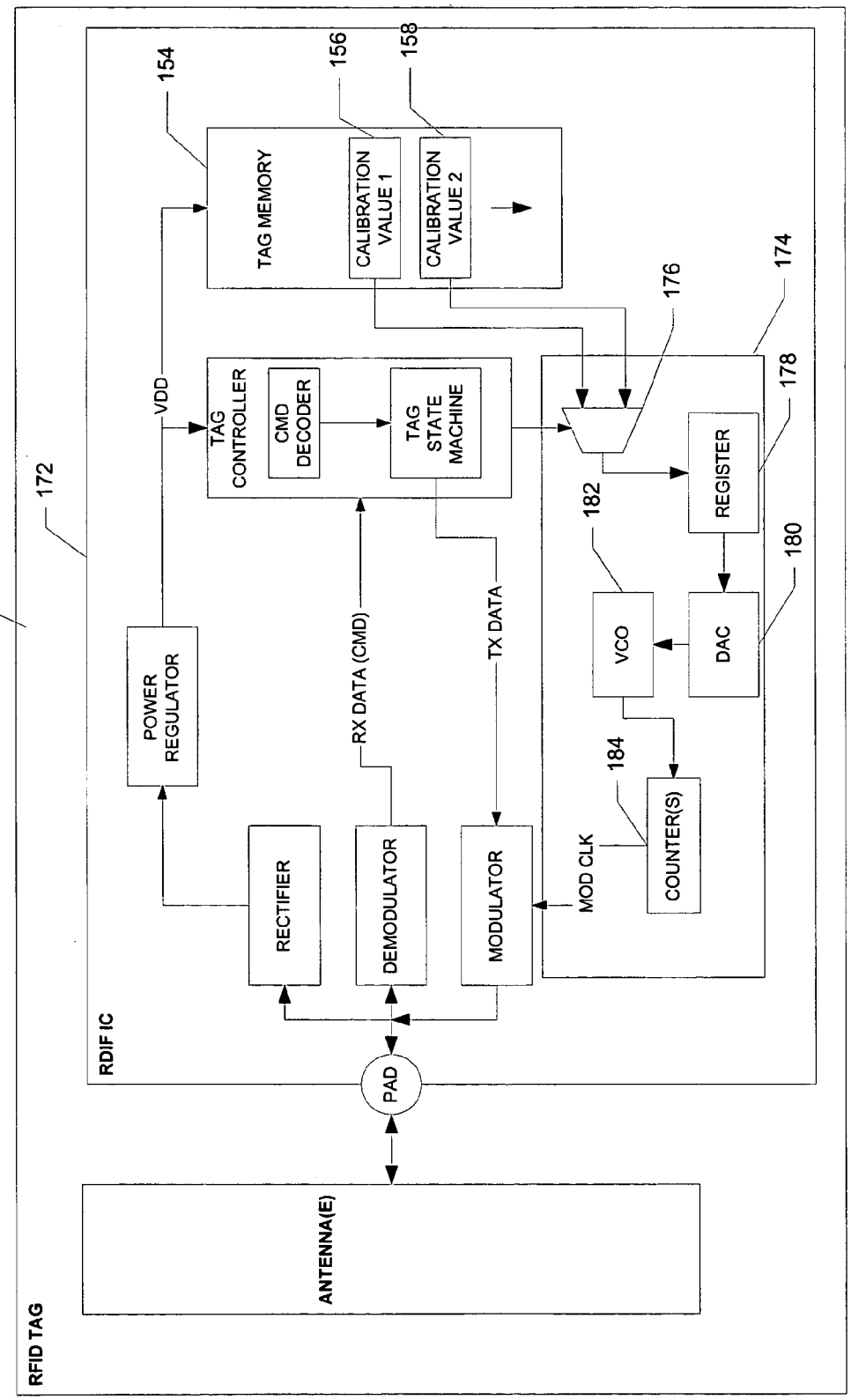
FIG. 12 is a diagrammatic representation of an RFID tag, according to one further exemplary embodiment of the present invention, wherein clock generation circuitry of an RFID integrated circuit includes a voltage-controlled oscillator (VCO).

FIG. 12 is a diagrammatic representation of an RFID tag 170, according to one further exemplary embodiment of the present invention. The architecture of the RFID tag 170 illustrated in FIG. 12 differs from that illustrated in FIG. 11 in that the clock generation circuitry 174 of the RFID integrated circuit 172 includes a voltage-controlled oscillator (VCO) 182, as opposed to the digitally-controlled oscillator 166 of the RFID integrated circuit 152. Accordingly, the clock generation circuitry 174 is shown to include a register 178 to store a selected calibration value outputted from the MUX 176, a digital-to-analog converter (DAC) 180 to convert the selected calibration value stored in the register 178 to a voltage signal, the voltage control oscillator 182, and a counter 184.

Figure 13:
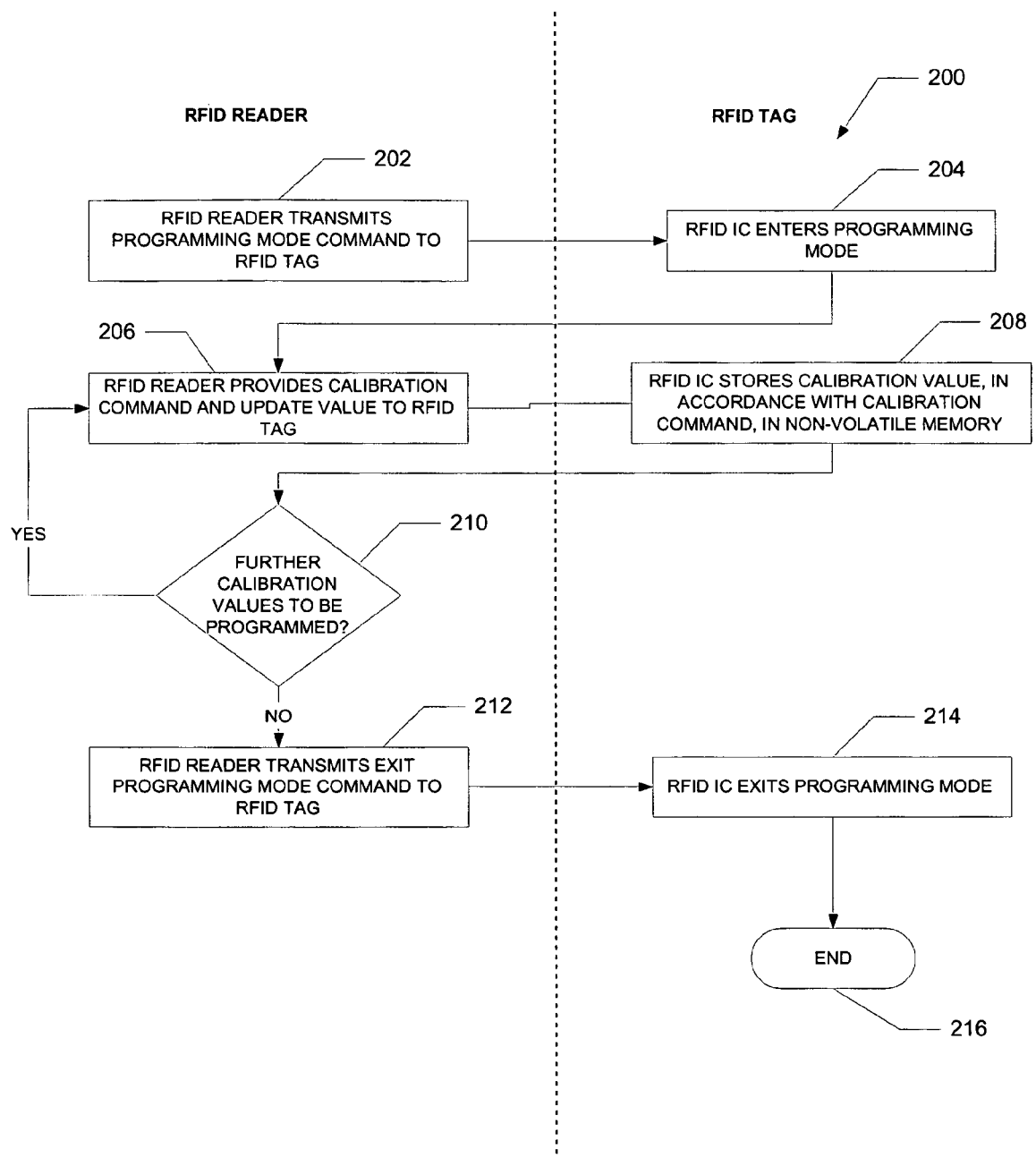
FIG. 13 is a flowchart illustrating a method, according to an exemplary embodiment of the present invention, to program calibration of an oscillator within a radio-frequency identification (RFID) integrated circuit for use in a RFID tag.

FIG. 13 is a flowchart illustrating a method 200, according to an exemplary embodiment of the present invention, to program calibration of an oscillator within a radio-frequency identification (RFID) integrated circuit for use in a RFID tag. The programming performed in the method 200 is performed by an RFID reader device, which communicates with the RFID tag utilizing a radio-frequency forward link. The method 200 may be performed within the context of a system 67 such as that shown in FIG. 8A.

The method 200 commences at block 202 with the RFID reader transmitting a calibration mode command to the RFID tag, in order to place the tag into a programming mode (e.g., the programming mode 64 discussed above with reference to FIG. 6). Responsive to receipt of the programming mode command, at block 204, the RFID integrated circuit enters a programming mode in which the RFID reader is provided with command access to a non-volatile memory that forms part of the RFID integrated circuit, or alternatively is a distinct non-volatile memory to which the RFID integrated circuit has access.

At block 206, the RFID reader then proceeds to transmit a calibration command to the RFID tag, the calibration command in one exemplary embodiment instructing the RFID tag to write an update value to a non-volatile tag memory of the RFID tag. In the exemplary embodiment, the calibration command takes the form of a "write" command in the following format:

[Preamble: 6-bit], [Command: 8-bit], [Memory Address: 2-bit], [Data: 16-bit], [CRC: 8-bit]

The 8-bit command is recognized by a command decoder 122 of a tag controller 118 as specifying a write command, with the data (e.g., the update value) being included within the 12-bit data portion of the write command.

Returning to the flowchart illustrated in FIG. 13, at block 208, the RFID integrated circuit, having received a radio-frequency signal from the RFID reader in which the command is modulated, demodulates the received radio-frequency signal utilizing the demodulator 110, and communicates the command data to the command decoder 122 of the tag controller 118. The command decoder 122 then provides the appropriate command information to the tag state machine 124 which then proceeds to write the included update value into the non-volatile memory 120 associated with the RFID integrated circuit.

As was noted above, the update value that is communicated as part of the command data at block 206, and that is received by the RFID integrated circuit, may itself constitute a calibration value, which is then written to the non-volatile memory 120. In an alternative embodiment, the update value may be a value by which a previously calculated and stored calibration value 126 is to be modified. In this case, the command associated with the update value may further instruct an increment or a decrement operation with respect to a stored calibration value 126, utilizing the update value. In this embodiment, the operations performed at block 208 accordingly include the performance of an appropriate increment or decrement operation to thereby generate a new calibration value 126 to be written into the non-volatile memory 120.

The method 200 then proceeds to decision block 210, where the RFID reader determines whether any further calibration values are to be written into the non-volatile memory of the target RFID tag. For example, as noted above with reference to FIGS. 11 and 12, multiple calibration values 156, 158 may be stored within the non-volatile memory of an RFID tag. In the event that it is determined at decision block 210 that further calibration values are in fact to be programmed, the method 200 loops back to block 206.

On the other hand, if no further calibration values are to be programmed, the method 200 proceeds to block 212, and the RFID reader transmits an exit programming mode command to the RFID tag, responsive to which the RFID integrated circuit exits programming mode at block 214. The exit programming mode command may be a "lock" command that operates to prevent subsequent write operations to the non-volatile memory of the RFID tag. The method 200 then terminates at block 216.

While the method 200 is described above as having the RFID reader transmit a programming mode command and an exit programming mode command to the RFID integrated circuit to render the RFID integrated circuit programmable and non-programmable with respect to update values, it will be appreciated that, in other embodiments of the present invention, the RFID integrated circuit could automatically enter a programming mode upon receiving a calibration command, such as that discussed with reference to block 206.

It is worth noting that the programming of the calibration values into the non-volatile memory of the RFID tag, as discussed above with reference to FIG. 13, is not dependent upon the frequency of the radio-frequency signal transmitted by the RFID reader. In other words, the calibration value that is written into the non-volatile memory is not derived from a frequency of the forward link radio-frequency signal itself, but is rather communicated as, or derived from, a specific value associated with a command communicated from the RFID reader to the RFID tag.

Figure 14:
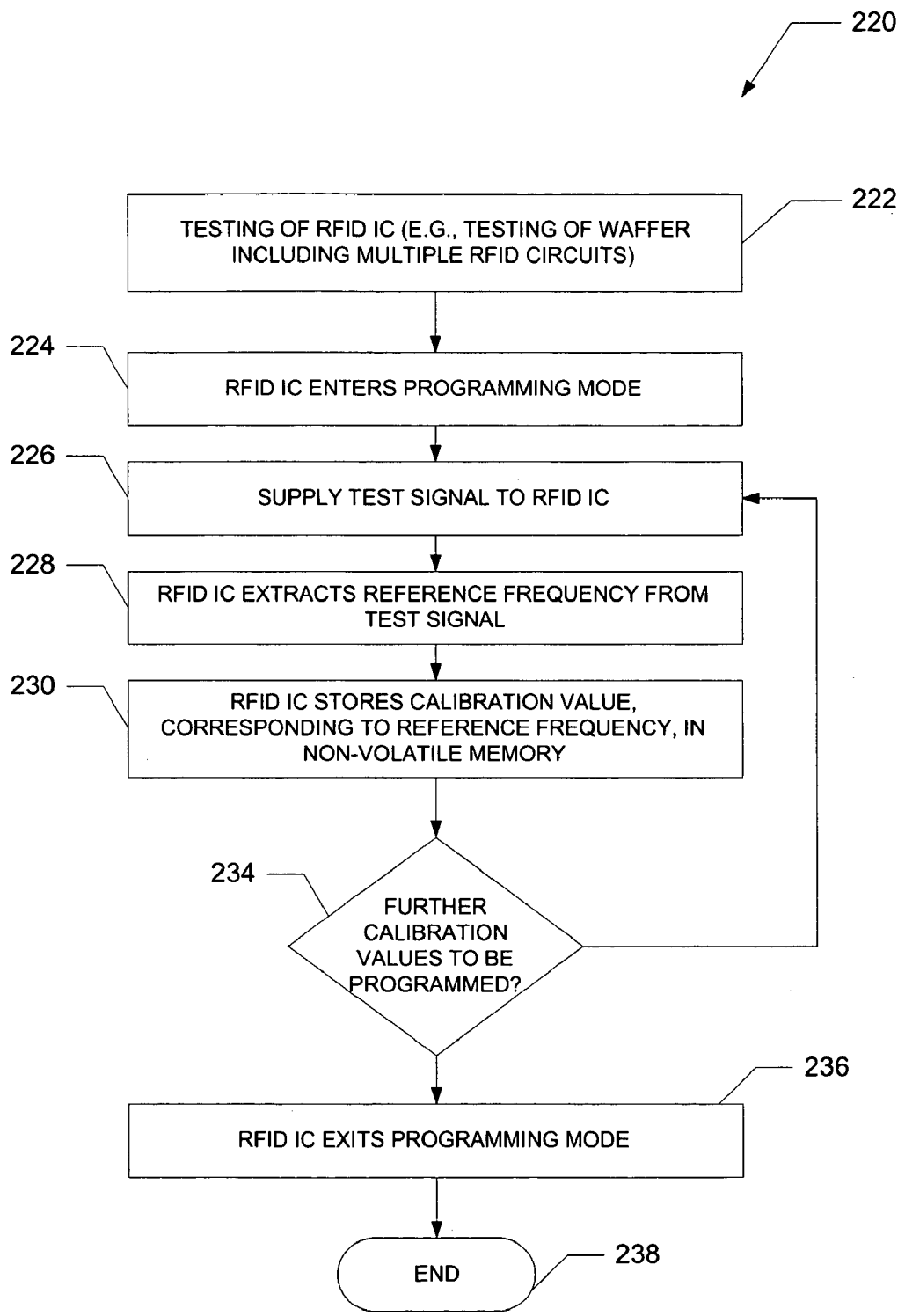
FIG. 14 is a flowchart illustrating a method, according to a further embodiment of the present invention, to program calibration of an oscillator within a radio-frequency identification (RFID) integrated circuit, using a test device.

FIG. 14 is a flowchart illustrating a method 220, according to a further embodiment of the present invention, to program calibration of an oscillator within a radio-frequency identification (RFID) integrated circuit. The programming performed in the method 220 is performed by a test device 68, for example within the context of a system 66 as described above with reference to FIG. 7B.

The method 220 commences at block 222 with the initiating and testing of an RFID integrated circuit. The testing of the RFID integrated circuit may be as part of the testing of an entire wafer on which the RFID integrated circuit is included, a die including the RFID integrated circuit, of the RFID integrated circuit once rendered as a distinct chip, or as part of testing the assembled RFID tag.

At block 224, the RFID integrated circuit optionally enters a programming mode. For example, a test device 168 may issue a programming mode command to the RFID integrated circuit 70 to cause the RFID integrated circuit to transition into the programming mode. At block 226, the test device 68 then provides a test signal to the RFID integrated circuit 70. In one embodiment of the present invention, the test signal has predetermined reference frequency that the RFID integrated circuit 70 utilizes to record a calibration value 76 within a non-volatile memory associated therewith. In alternative embodiments, the test signal may include a command, and an associated update value, for a specification of a calibration value 76. Further, in one embodiment, the test signal may be a DC power line test signal that is applied to the RFID integrated circuit. At block 228, the RFID integrated circuit recovers the reference frequency from the provided test signal. Specifically, the calibration module 75 of the RFID integrated circuit 70 may operate, as described above, with reference to FIG. 7B to extract the reference frequency from the received test signal, and to compare the extracted reference frequency to a current frequency of the oscillator 82. Based on this comparison, the calibration module 75 then calculates a calibration value, appropriate to calibrate the oscillator 82 to the extracted reference frequency.

At block 230, the RFID integrated circuit then stores the calibration value, corresponding to the reference frequency, within the non-volatile memory. Specifically, the calibration module 75 may proceed to write the calibration value 76 into the non-volatile memory, as illustrated in FIG. 7B. The operations performed at blocks 228-230 may be iteratively performed in order to determined the proper calibration value to be stored at block 230.

At decision block 234, a determination may be made whether any further calibration values (e.g., corresponding to alternative backscatter modulation frequencies) need to be programmed. This determination may be made at the test device 68 or may alternatively be made at the calibration module 75, responsive to which the calibration module 75 may provide an appropriate signal back to the test device 68. In the event that further calibration values are to be programmed, the method 220 then loops back to block 226. On the other hand, should no further calibration values need to be programmed, the method 220 proceeds to block 236, where the RFID integrated circuit 70 exits programming mode. The method then terminates at block 238.

Figure 15:
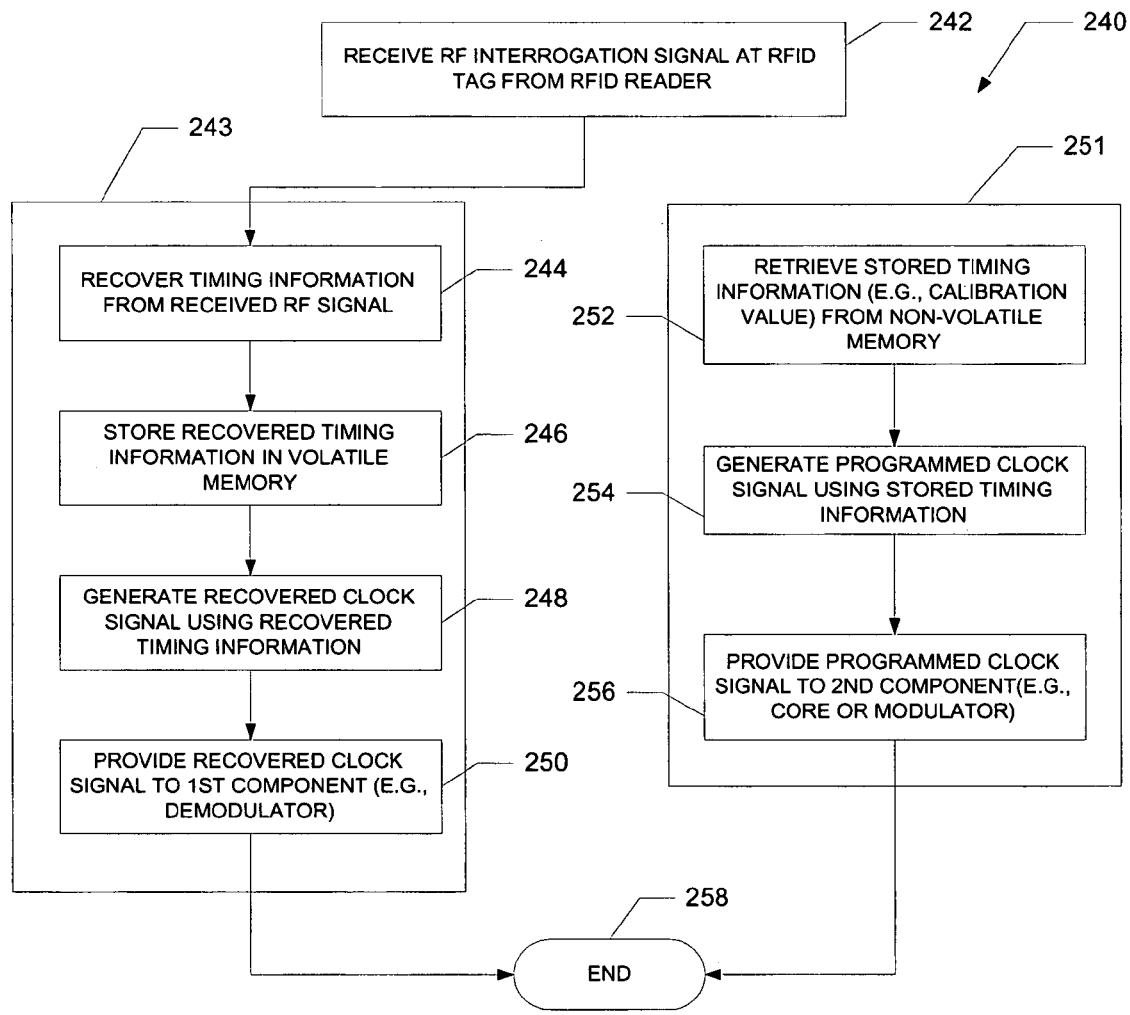
FIG. 15 is a flowchart illustrating a method, according to an exemplary embodiment of the present invention, to calibrate an oscillator within a radio-frequency identification (RFID) circuit that may form part of an RFID tag, and to generate various clock signals within the RFID circuit in accordance with an output of the oscillator.

FIG. 15 is a flowchart illustrating a method 240, according to an exemplary embodiment of the present invention, to calibrate an oscillator within a radio-frequency identification (RFID) circuit that may form part of an RFID tag, and to generate various clock signals within the RFID circuit accordance with an output of the oscillator.

The method 240 commences at block 242 with the receipt, at an RFID tag, of a radio-frequency interrogation signal from an RFID reader. The flowchart of FIG. 15 depicts two high-level operations as performed within the RFID integrated circuit of the RFID tag. Specifically, as designated generally at 243, a recovered clock signal may optionally be generated within the RFID tag based on the received radio-frequency interrogation signal. Separately, and possibly concurrently, as designated generally at 251, one or more programmed clock signals may also be generated within the RFID integrated circuit of the RFID tag. While the generation of the recovered clock signal at 243 may be dependent upon the reception of the radio-frequency interrogation signal, the generation of the programmed clock signals at 251 is not necessarily dependent upon reception of an interrogation signal, as will be more fully appreciated from the below reading. Specifically, the calibration of an oscillator within an RFID circuit from a stored value does not presuppose the reception of an interrogation signal.

Turning first to the generation of the recovered clock signal, at block 244, timing information is recovered from the received radio-frequency interrogation signal. Referring, for example, to the exemplary RFID tag illustrated in FIG. 10, the received interrogation signal is received at the demodulator 110 of the RFID integrated circuit 141. The demodulator 110 includes clock recovery circuitry (not shown) that then proceeds to recover the relevant timing information from the received interrogation signal. At block 246, the recovered timing information is written from the demodulator 110 to a volatile memory 109, associated with the digitally-controlled demodulator oscillator 146. At block 248, a recovered clock signal is generated utilizing the recovered timing information, as stored in the volatile memory 109. Specifically, in one exemplary embodiment, the timing information stored within volatile memory 109 provides digital input to the digitally-controlled demodulator oscillator 146, which then outputs a recovered clock signal in the exemplary form of the demodulator clock signal 149.

At block 250, the recovered clock signal is provided to at least one component of the RFID integrated circuit 141. For example, the demodulator clock signal 149 is provided to the demodulator 110.

Turning now to the generation of a programmed clock signal, which may or may not occur in parallel with the generation of the recovered clock signal, at block 252 stored timing information, in the exemplary form of a calibration value 126, is retrieved from a non-volatile memory (e.g., the tag memory 120). The stored timing information may have been written into the non-volatile memory utilizing any one of the methods described above. Where the non-volatile memory stores multiple calibration values, the retrieval of the stored timing information at block 252 may include selection of a selected calibration value according to one or more selection criterion, discussed above with reference to FIG. 11.

At block 254, a programmed clock signal is generated utilizing the stored timing information. Again referring to the exemplary embodiment illustrated in FIG. 10, stored timing information in the exemplary form of a calibration value 126 may be provided to a digitally-controlled modulator/core oscillator 142, which in turn outputs a frequency signal to a counter module 132. The counter module 132 then outputs a programmed clock signal in the exemplary signal in the exemplary form of a modulator clock signal 136.

In the alternative embodiment of the present invention described with reference to FIG. 12, the generation of the programmed clock signal may be performed utilizing a voltage-controlled oscillator (VCO).

At block 256, the programmed clock signal is provided to at least one component of the RFID integrated circuit. Referring again to the exemplary embodiment illustrated in FIG. 10, the counter module 132 may, for example, provide the modulator clock signal 144 to a modulator 112, as well as provide a core clock signal 148 to at least the tag controller 118 of the RFID integrated circuit 141. The method 240 then terminates at block 258.

In summary, it will be noted that the exemplary method 240 may optionally include the generation of both a recovered clock signal and a programmed clock signal within a common RFID integrated circuit. To this end, the relevant RFID integrated circuit may employ the dual-oscillator (or multi-oscillator) architecture discussed above with reference to FIG. 10.

FIGS. 16-24 are diagrammatic representations of various exemplary embodiments. In FIGS. 16-24, for the purposes of clarity, only selected components and signals have been illustrated.

Figure 16:
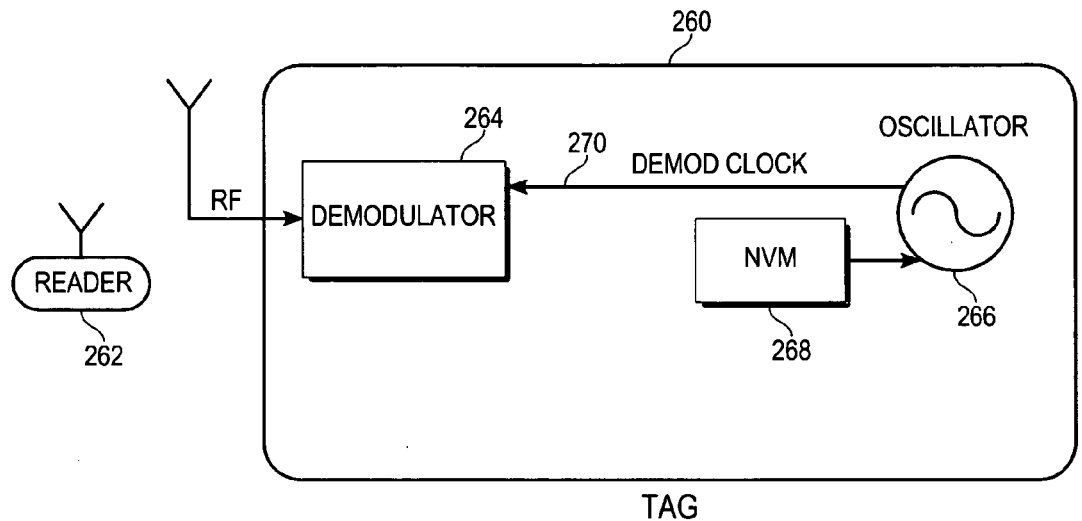
FIGS. 16-24 are diagrammatic representation providing high-level representations of various exemplary embodiments of the present invention.

Turning first to FIG. 16, an RFID tag 260 is shown to be interrogated by, and to respond to, an RFID reader 262. The RFID tag 260 receives a forward-link radio-frequency signal, which is communicated to a demodulator 264. The RFID tag 260 further includes a digitally-controlled oscillator (DCO) 266, which is calibrated using a calibration value stored within a non-volatile memory 268, and generates a demodulator clock signal 270. The calibration value stored within the non-volatile memory 268 may be written into the memory 268 utilizing any one of the methods discussed above. Accordingly, a non-volatile memory (NVM) calibrated-oscillator is utilized to generate the demodulator clock signal 270 to clock the demodulator 264 utilizing timing information recovered from the forward-link radio-frequency signal. In one embodiment, in order to ensure a required accuracy in the demodulation of the forward-link radio-frequency signal, the demodulator clock signal 270 may be programmed so that the demodulator 264 oversamples the received forward-link radio-frequency signal. The arrangement illustrated in FIG. 16 is advantageous in that no training sequence is required to calibrate the oscillator 266 based on recovered timing information from the forward-link radio-frequency signal.

Figure 17:
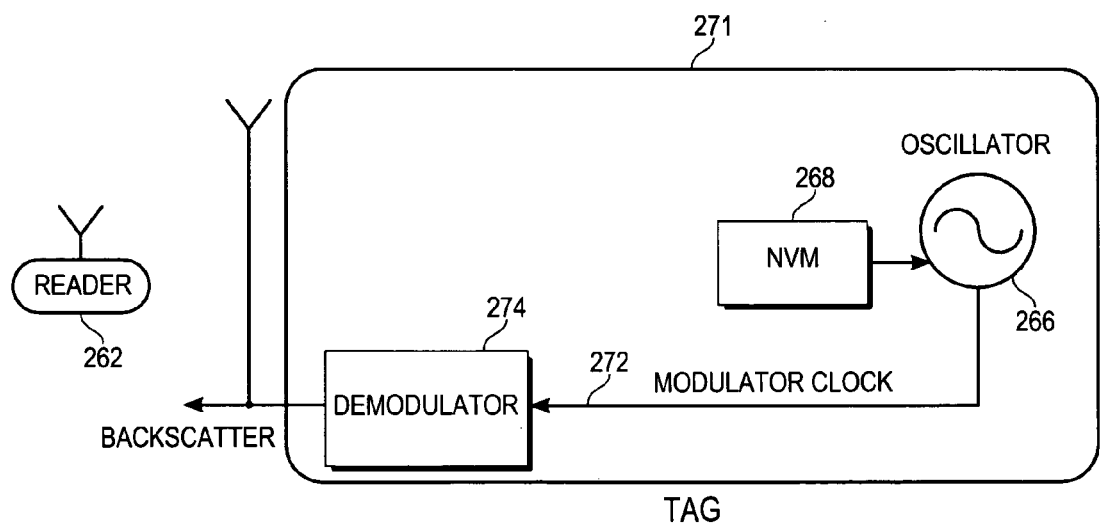

FIG. 17 is a diagrammatic representation of an RFID tag 271, in which the NVM-calibrated oscillator 266 is utilized to drive a modulator clock signal 272, which is in turn utilized to clock a modulator 274 of the RFID tag 271. Accordingly, it will be appreciated that a frequency of a backscatter-modulated radio-frequency signal 276, transmitted from the RFID tag 271 to the RFID reader 262, is related to the frequency of the modulator clock signal 272. It should furthermore be noted that the modulator clock signal 272 is not necessarily related to the demodulator clock signal 270. For example, the demodulator and modulator clock signals 270 and 272 may be driven by different calibration values stored within the non-volatile memory 268. Further, in a dual-oscillator architecture, separate oscillators may be provided to generate each of the demodulator and modulator clock signals 270 and 272.

Figure 18:
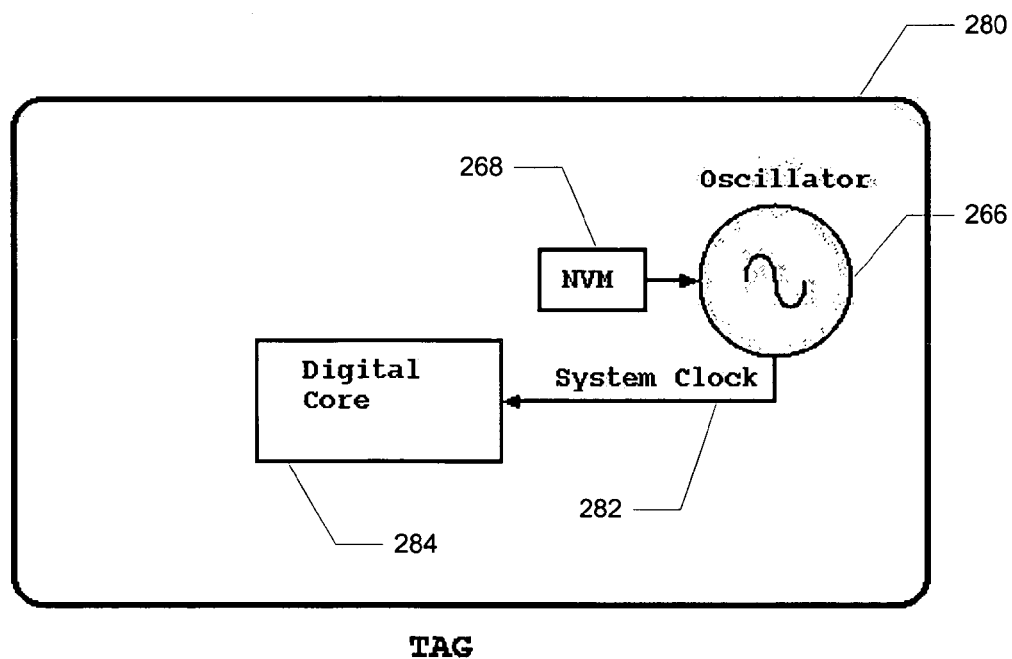

FIG. 18 is a block diagram illustrating an exemplary RFID tag 280, in which an NVM-calibrated clock signal 282 is provided to a digital core 284 of the RFID tag 280. Again, the system clock signal 282 need not necessarily be related to the demodulator and modulator clock signals 270 and 272 discussed above. For example, independent calibration values may be stored within the non-volatile memory 268 to generate each of the clock signals 270, 272 and 282. Further, independent oscillators 266 may be provided to generate each of these clock signals. Of course, in certain embodiments, each of the clock signals 270, 272, and 282 may, in fact, be driven by a common calibration value, stored within a common non-volatile memory, and provided to a common oscillator 266.

Figure 19:
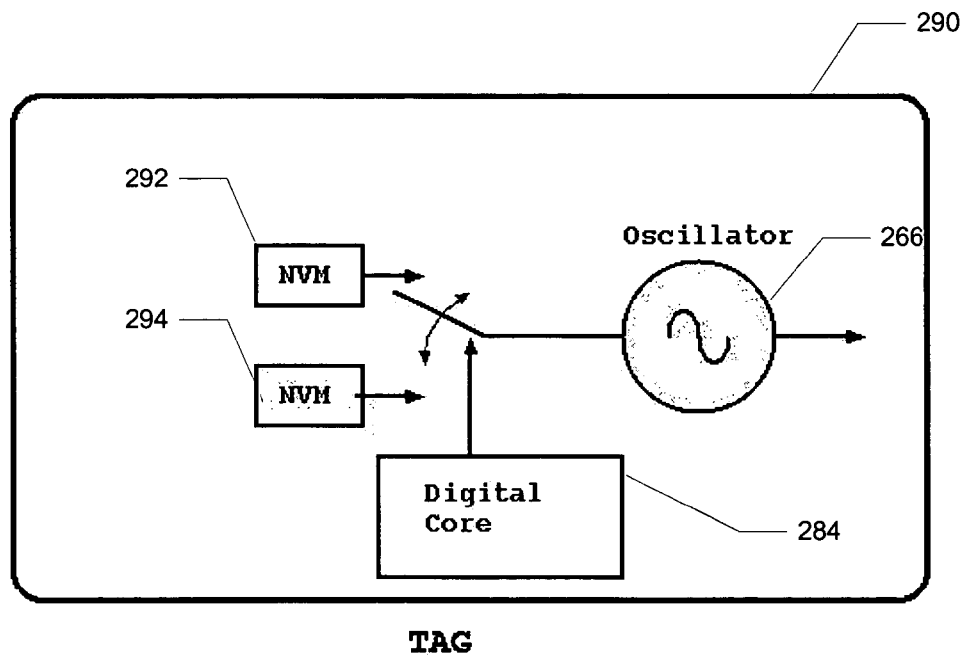

FIG. 19 is a diagrammatic representation of an RFID tag 290, according to one exemplary embodiment of the present invention, with an oscillator 266 being driven by any one of a multiple calibration values stored within a non-volatile memory structure. Specifically, the provision of one of the calibration values 292 and 294 to the oscillator 266 is shown to be controlled by an on-chip digital controller, in the exemplary form of the digital core 284. The high-level architecture depiction shown in FIG. 19 could, it will be appreciated, be implemented in the manner discussed above with reference to FIG. 11, wherein calibration values 156 and 158 are stored within a non-volatile memory 154, and wherein the digital core 284 includes the tag controller 118, which in turn includes the tag state machine 124 that outputs a selection signal 164 to select between one of multiple calibration values. As also noted above, the selection of the appropriate calibration value 292 or 294 may be dependent upon any number of factors, including a mode of operation of the digital core 284, commands received at the RFID tag 290 from an RFID reader 262, tag temperature, tag voltage, etc.

Figure 20:
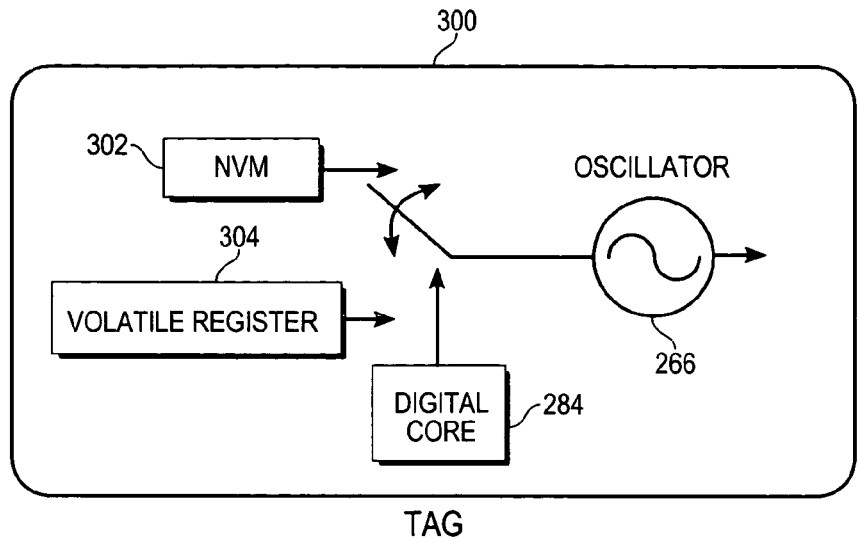

FIG. 20 is a diagrammatic representation of an RFID tag 300 according to further embodiment of the present invention, wherein an oscillator 266 is driven by a calibration value stored within a non-volatile memory 302, or alternatively by a calibration value stored within a volatile memory (e.g., a register 304). The non-volatile memory 302 may itself store multiple calibration values between which a selection may also be made. The choice between a calibration value stored within the non-volatile memory 302 and the volatile register 304 is, as with the embodiment described below with reference to FIG. 19, controlled by the digital core 284. Specifically, a digital state (e.g., the state of a tag state machine 124) may determine the selection performed by the digital core 284. For example, when the RFID tag 300 is receiving a forward-link radio-frequency signal that requires demodulation, the digital core 284 may place the RFID tag 300 in a demodulation state, and accordingly select a value within the volatile register 304 to drive the oscillator 266, and to output an appropriate demodulation clock to a demodulator (not shown). Alternatively, when the RFID tag 300 is transmitting a backscatter modulated radio-frequency signal as a reply to an RFID reader, the digital core 284 may place the RFID tag 300 in a modulation state, and accordingly select a calibration value within the non-volatile memory 302 to drive the oscillator 266. The oscillator 266 will then accordingly output an appropriate modulation clock signal to a modulator (not shown).

It should furthermore be noted that one or more of calibration values stored within the non-volatile memory 302 may be programmatically written and stored within the memory 302, whereas a value stored within the volatile register 304 may represent recovered timing information, recovered from a forward link radio-frequency signal received at the RFID tag 300.

Figure 21:
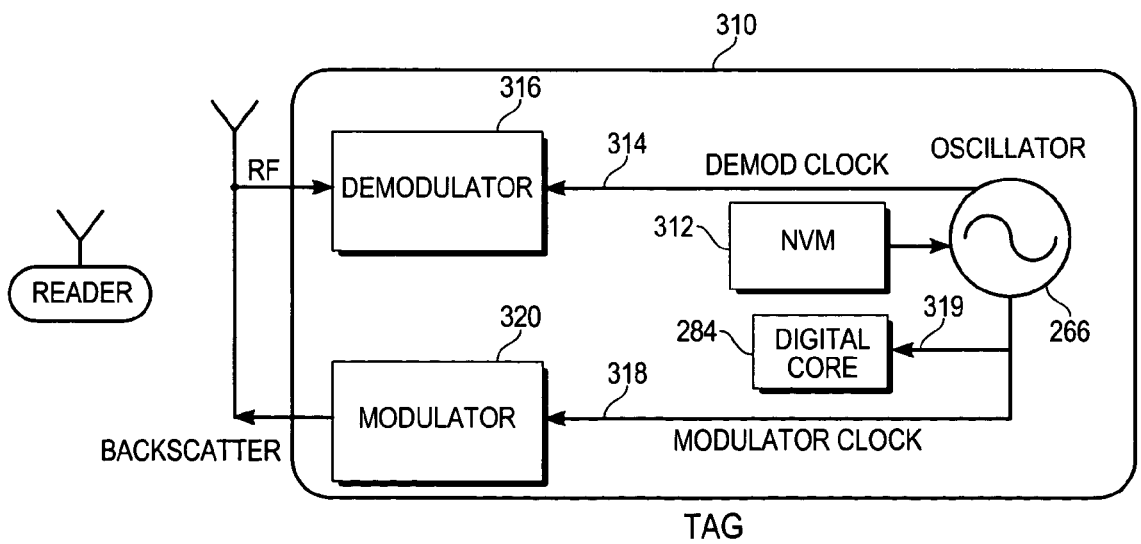
Figure 22:
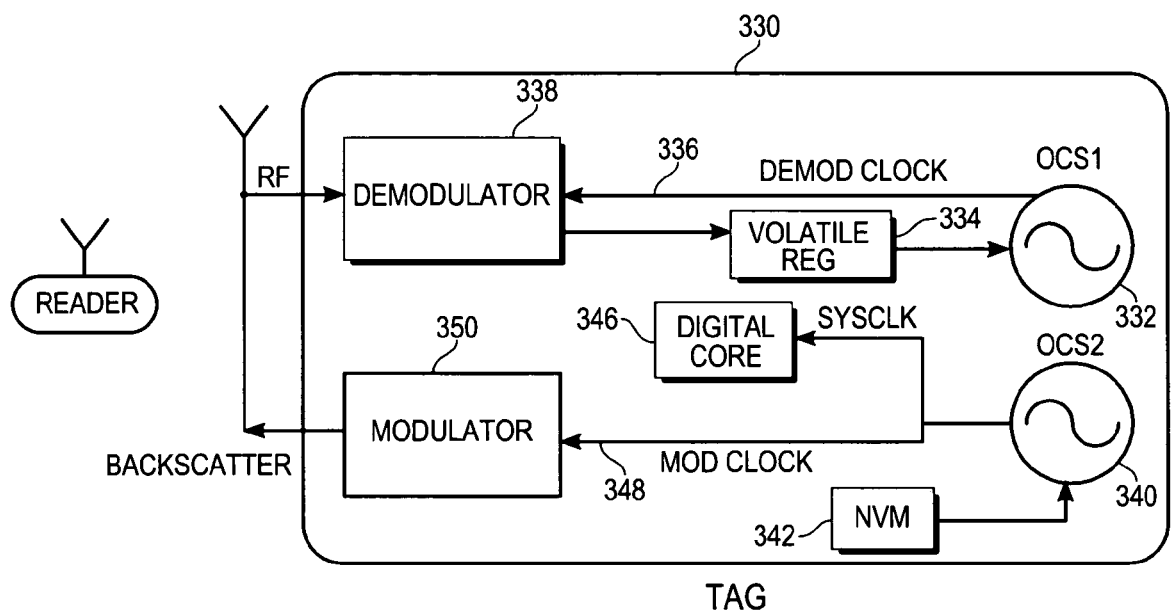

FIG. 21 is a diagrammatic representation of an RFID tag 310, according to one embodiment of the present invention, where a single NVM-calibrated oscillator 266 is utilized to drive modulator, demodulator, and system clock signals 314, 318, and 319. This embodiment is in contrast to a further exemplary embodiment of an RFID tag 330, illustrated in FIG. 22, which employs a multi-oscillator architecture. Specifically, in the embodiment illustrated in FIG. 22, a first oscillator 322 is dedicated to the generation of a demodulation clock 336, and is driven by timing information recovered from a forward-link radio-frequency signal, and represented by a calibration value stored within a volatile register 334 that provides input to the oscillator 332. A second oscillator 340 is responsible for the generation of a modulator clock signal 348 and a system clock signal 344. The second oscillator 340 is calibrated utilizing a calibration value stored within a non-volatile memory 342, which provides input to the second oscillator 340.

Figure 23:
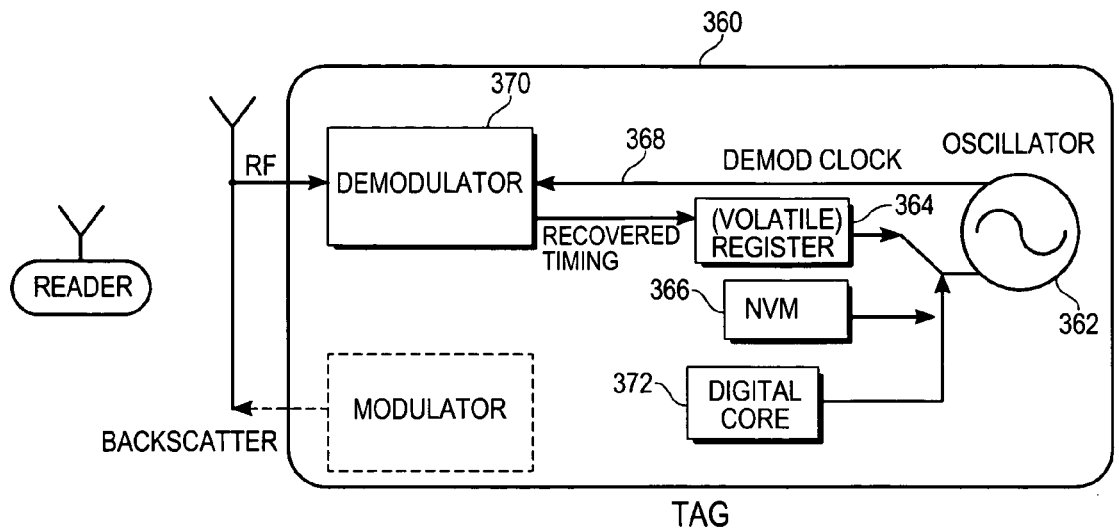
Figure 24:
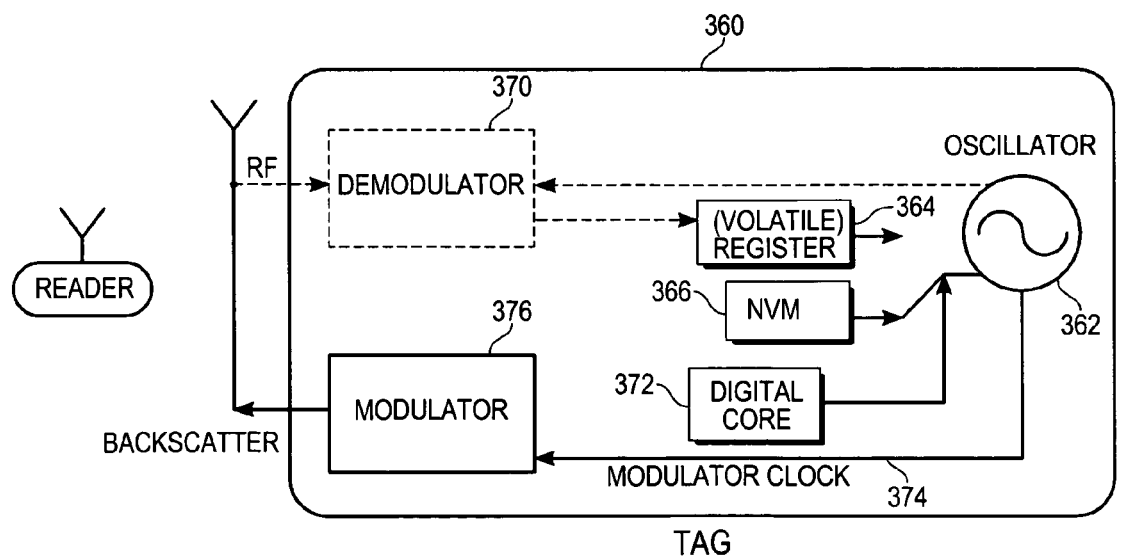

FIGS. 23 and 24 are diagrammatic representations of an RFID tag 360, according to an even further exemplary embodiment of the present invention, with a single oscillator which is selectively calibrated utilizing values stored within a non-volatile memory 366 and values stored within a volatile memory, in an exemplary form of a volatile register 364. The non-volatile memory 366 and the volatile register 364 provide an example of a tag memory structure. As has been discussed in detail above, the selective provision of a calibration value from either the non-volatile memory 366 or the volatile register 364 is controlled by a digital core 372, and may be based on a state occupied by the RFID tag. FIG. 23 illustrates that, during data recovery, the oscillator 362 is driven by a calibration value stored within the volatile register 364, to generate a demodulator clock signal 368. The calibration value stored within the volatile register 364 is furthermore shown to reflect recovered timing information, as generated an outputted by a demodulator 370. Accordingly, during data recovery, the demodulator clock signal 368 may be set according to timing information recovered from a forward link radio-frequency signal received at the RFID tag 360.

FIG. 24, on the other hand, illustrates that during modulation, the oscillator 362 may be driven by a calibration value stored within the non-volatile memory 366. As discussed above, the calibration value stored within the non-volatile memory 366 may be programmed (e.g., during a programming event or mode). Accordingly, the oscillator 362 is utilized to drive a programmed clock signal, in the exemplary form of the modulator clock signal 374, that is provided to the modulator 376. Accordingly, the modulator 376 backscatter modulates a transmitted radio-frequency signal in accordance with the received modulator clock signal 374. The calibration modules discussed above may employ any one of a number of calibration algorithms in order to determine one or more calibration values 76 to be stored within the non-volatile memory of an RFID tag. In one exemplary embodiment, a calibration module may employ the so-called Successive Approximation Algorithm (SAA) that assumes, without loss of generality, that higher settings give a higher frequency. Accordingly, the algorithm typically starts with the most-significant bit (MSB), recognizing the MSB as a test bit. The test bit is set to one, and all lower bits are set to zero. The inherent frequency of an oscillator 82 to be calculated is compared to an external reference frequency. As noted above, this reference frequency may be provided via a radio-frequency (or other air or a wired link (e.g., through probing at test time)). If the observed frequency of the oscillator 82 is too high, the test bit is set to zero, and the next most significant bit is selected as the test bit, and set to 1. The above process is repeated until the observed frequency of the oscillator 82 corresponds to the provided external reference frequency.

In a further embodiment, a calibration module may employ a feedback algorithm to generate one or more calibration values to be written into the non-volatile memory 78 of an RFID integrated circuit 70. Specifically, such an algorithm sets the calibrated output frequency of an oscillator 82 at a mid-range, and then counts how many external clock cycles (E) pass in a fixed number of internal clock cycles (I). The algorithm adjusts the calibrated outward frequency of the oscillator 82 proportionately to (E-I) until this value is sufficiently small.

Figure 25:
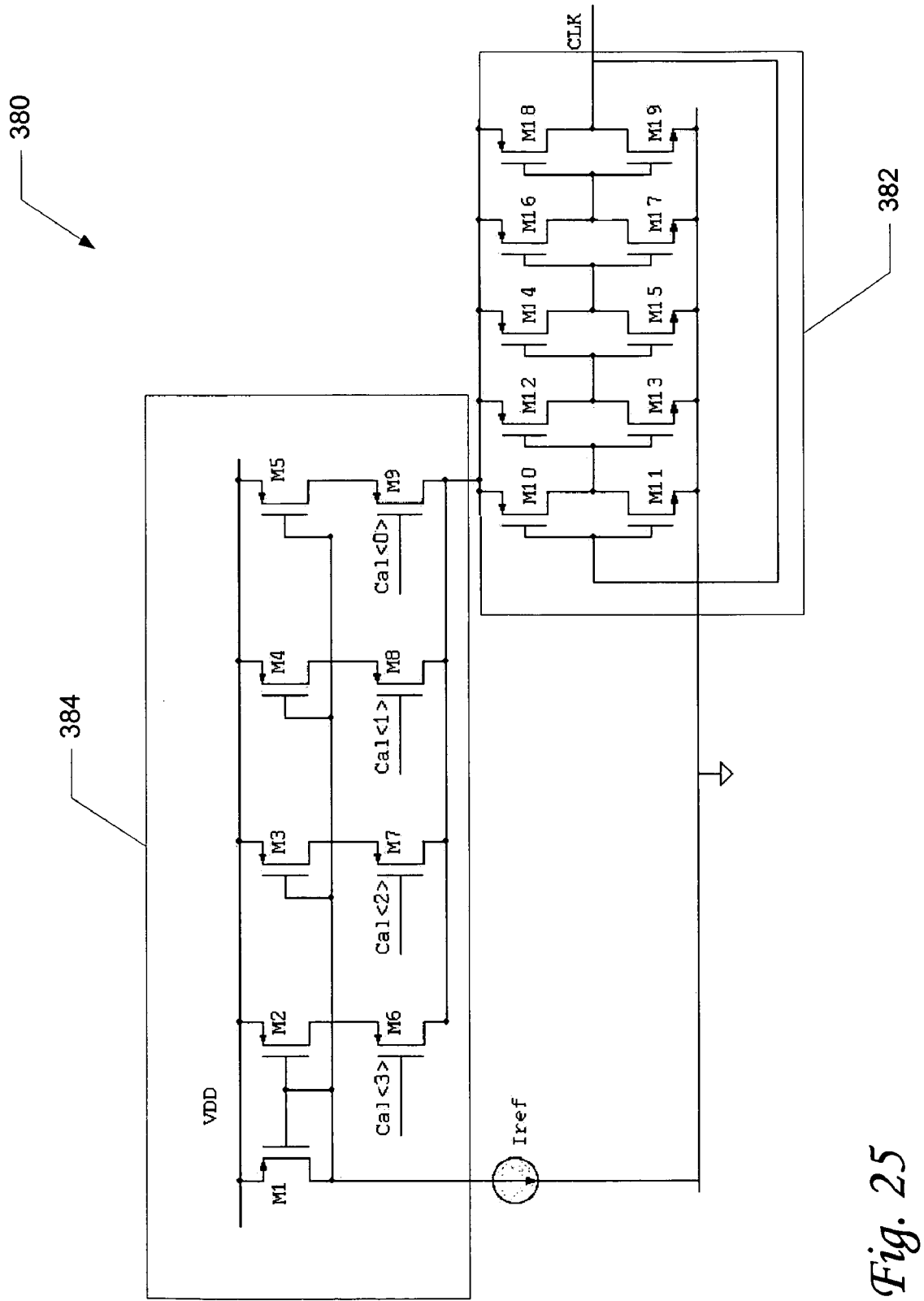
FIG. 25 is a schematic diagram illustrating a portion of exemplary clock generation circuitry including a core oscillator, and a calibration module.

FIG. 25 is a schematic diagram illustrating a portion of exemplary clock generation circuitry 380 including a core oscillator 382, and calibration module 384. Within the calibration module 384, M1 mirrors a reference current ($I_{ref}$) to M2-M5. Calibration is applied to the gates of M6-M9 to control the current supplied to the core oscillator 382.

It should also be noted that embodiments of the present invention may be implemented and not only as a physical circuit or module (e.g., on a semiconductor chip) but, also within a machine-readable media. For example, the circuits and designs described above may be stored upon, or embedded within, a machine-readable media associated with a design tool used for designing semiconductor devices. Examples include a netlist formatted in the VHSIC Hardware Description Language (VHDL), the Verilog language, or the SPICE language. Some netlist examples include a behavioral level netlist, a register transfer level, (RTL) netlist, a gate level netlist, and a transistor level netlist. Machine-readable media include media having layout information, such as a GDS-II file. Furthermore, netlist files and other machine-readable media for semiconductor chip design may be used in a simulation environment to perform any one or more methods described above. Thus it is also to be understood that embodiments of the present invention may be used, or to support, a software program executing on some processing core (e.g., a CPU of a computer system), or otherwise implemented or realized within a machine-readable medium. A machine-readable medium may include any mechanism for storing and transmitting information in a form readable by a machine (e.g., a computer). For example, a machine readable-readable medium may comprise a read-only memory (ROM), a random access memory (RAM), magnetic disc storage media, optical storage media, flash memory devices, electrical, optical, acoustic, or other form of propagated signal (e.g., a carrier wave, infrared signal, radio-frequency signal, a digital signal, etc.).

Thus, a calibrated oscillator for an RFID system, and methods of manufacturing and operating the same, has been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A system to calibrate an oscillator within a radio-frequency identification (RFID) circuit for use in an RFID tag, the oscillator having an oscillation frequency and the system including:
    an input, associated with the RFID circuit, to receive a test signal; and
    a calibration module to store a calibration value within a non-volatile memory associated with the RFID circuit, wherein the calibration module is to recover a reference frequency from the test signal, to calculate the calibration value to correspond to a difference between the recovered reference frequency and the oscillator frequency, and to write the calibration value to the non-volatile memory.

2. The system of claim 1, wherein the input is to receive the test signal via at least one of a wired link and a radio-frequency link.

3. The system of claim 1, wherein the test signal comprises a DC power signal supplied to the RFID circuit.

4. The system of claim 1, wherein the RFID circuit operates in one of at least a programming mode and interrogation mode, and the calibration module is to store the calibration value within the non-volatile memory in the programming mode.

5. The system of claim 1, wherein the calibration module is iteratively to calculate the calibration value and to write the calibration value to the non-volatile memory.

6. A method of calibrating an oscillator within a radio-frequency identification (RFID) circuit for use in an RFID tag, the oscillator having an oscillation frequency and the method including:
    storing a calibration value within a non-volatile memory associated with the RFID circuit; and
    calibrating the oscillator in accordance with the calibration value,
wherein the storing of the calibration value includes recovering a reference frequency from a test signal supplied to the RFID circuit, calculating the calibration value to correspond to a difference between the recovered reference frequency and the oscillator frequency, and writing the calibration value to the non-volatile memory.

7. The method of claim 6, wherein the test signal is supplied via at least one of a wired link and a radio-frequency link to the RFID circuit.

8. The method of claim 6, wherein the test signal comprises a DC power signal supplied to the RFID circuit.

9. The method of claim 6, wherein the RFID circuit operates in one of at least a programming mode and interrogation mode, and the storing of the calibration value within the non-volatile memory is performed in the programming mode.

10. The method of claim 6, including iteratively performing the calculation of the calibration value and the writing of the calibration value to the non-volatile memory.

11. A system to calibrate an oscillator within a radio-frequency identification (RFID) circuit for use in an RFID tag, the oscillator having an oscillation frequency and the system including:
    first means, associated with the RFID circuit, for receiving a test signal; and
    second means for storing a calibration value within a non-volatile memory associated with the RFID circuit,
wherein the second means is for recovering a reference frequency from the test signal, for calculating the calibration value to correspond to a difference between the recovered reference frequency and the oscillator frequency, and for writing the calibration value to the non-volatile memory.

12. A machine-readable medium storing a description of a circuit, said circuit comprising:
    an input, associated with an RFID circuit, to receive a test signal; and
    a calibration module to store a calibration value within a non-volatile memory associated with the RFID circuit, wherein the calibration module is to recover a reference frequency from the test signal, to calculate the calibration value to correspond to a difference between the recovered reference frequency and an oscillator frequency of an oscillator of the RFID circuit, and to write the calibration value to the non-volatile memory.

13. The machine-readable medium of claim 12, wherein the description comprises a behavioral level description of the circuit.

14. The machine-readable medium of claim 13, wherein the behavioral level description is compatible with a VHDL format.

15. The machine-readable medium of claim 13, wherein the behavioral level description is compatible with a Verilog format.

16. The machine-readable medium of claim 12, wherein the description comprises a register transfer level netlist.

17. The machine-readable medium of claim 12, wherein the description comprises a transistor level netlist.

* * * * *

UNITED STATES PATENT AND TRADEMARK OFFICE
CERTIFICATE OF CORRECTION

| | |
|---|---|
| PATENT NO. | : 7,394,324 B2 |
| APPLICATION NO. | : 10/824071 |
| DATED | : July 1, 2008 |
| INVENTOR(S) | : Diorio et al. |

It is certified that error appears in the above-identified patent and that said Letters Patent is hereby corrected as shown below:

Drawing
On sheet 8 of 17, in Fig. 12 (Box. 172), line 1, delete "RDIF" and insert -- RFID --, therefor.

Signed and Sealed this

Seventh Day of October, 2008

JON W. DUDAS
*Director of the United States Patent and Trademark Office*